(12) United States Patent
Hosotani et al.

(10) Patent No.: US 7,932,513 B2
(45) Date of Patent: Apr. 26, 2011

(54) MAGNETIC RANDOM ACCESS MEMORY, AND WRITE METHOD AND MANUFACTURING METHOD OF THE SAME

(75) Inventors: Keiji Hosotani, Sagamihara (JP); Yoshiaki Asao, Sagamihara (JP); Toshihiko Nagase, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 569 days.

(21) Appl. No.: 12/043,617

(22) Filed: Mar. 6, 2008

(65) Prior Publication Data

US 2008/0225577 A1 Sep. 18, 2008

(30) Foreign Application Priority Data

Mar. 9, 2007 (JP) .................................. 2007-060693

(51) Int. Cl.
*H01L 29/06* (2006.01)
*H01L 29/08* (2006.01)
*H01L 39/00* (2006.01)

(52) U.S. Cl. .................. 257/30; 257/421; 257/E21.665; 257/422; 257/295; 438/48; 438/3; 438/52; 365/158; 365/171; 365/173

(58) Field of Classification Search .................. 257/421, 257/30, 427, 295, 423, 422, E21.665; 438/48, 438/3, 52; 365/158, 171, 173
See application file for complete search history.

(56) References Cited

U.S. PATENT DOCUMENTS

| | | | |
|---|---|---|---|
| 6,797,536 B2 * | 9/2004 | Yoda et al. | 438/48 |
| 6,879,515 B2 | 4/2005 | Yoda et al. | |
| 6,958,932 B2 | 10/2005 | Hosotani et al. | |
| 6,960,815 B2 | 11/2005 | Yoda et al. | |
| 7,190,613 B2 | 3/2007 | Nagase et al. | |
| 2004/0051094 A1 * | 3/2004 | Ooishi | 257/5 |
| 2005/0274984 A1 | 12/2005 | Hosotani et al. | |
| 2008/0037314 A1 * | 2/2008 | Ueda | 365/158 |

OTHER PUBLICATIONS

Roy Scheuerlein, et al., "A 10ns Read and Write Non-Volatile Memory Array Using a Magnetic Tunnel Junction and FET Switch in each Cell", 2000 IEEE International Solid-State Circuits Conference, Digest of Technical Papers, Feb. 2000, 10 Pages.

(Continued)

*Primary Examiner* — Zandra Smith
*Assistant Examiner* — Telly D Green
(74) *Attorney, Agent, or Firm* — Oblon, Spivak, McClelland, Maier & Neustadt, L.L.P.

(57) ABSTRACT

A magnetic random access memory includes a bit line running in a first direction, a first word line running in a second direction different from the first direction, and a memory element having a magnetoresistive effect element including a fixed layer having a fixed magnetization direction, a recording layer having a reversible magnetization direction, and a nonmagnetic layer formed between the fixed layer and the recording layer, the magnetization directions in the fixed layer and the recording layer being perpendicular to a film surface, and a heater layer in contact with the magnetoresistive effect element, the memory element being connected to the bit line, and formed to oppose a side surface of the first word line such that the memory element is insulated from the first word line.

10 Claims, 14 Drawing Sheets

OTHER PUBLICATIONS

M. Durlam, et al., "A low power 1Mbit MRAM based on 1T1MTJ bit cell integrated with Copper Interconnects", 2002 Symposium on VLSI Circuits Digest of Technical Papers, 2002, 4 Pages.

Naoki Nishimura, et al., "Magnetic tunnel junction device with perpendicular magnetization films for high-density magnetic random access memory", Journal of Applied Physics, vol. 91, No. 8, Apr. 15, 2002, pp. 5246-5249.

T. Ikeda, et al., "GMR and TMR Films Using GdFe Alloy with Perpendicular Magnetization", Journal of Japan Applied Magnetics, vol. 24, No. 4-2, 2000, pp. 563-566.

* cited by examiner

Parallel (low resistance)

Anti-parallel (high resistance)

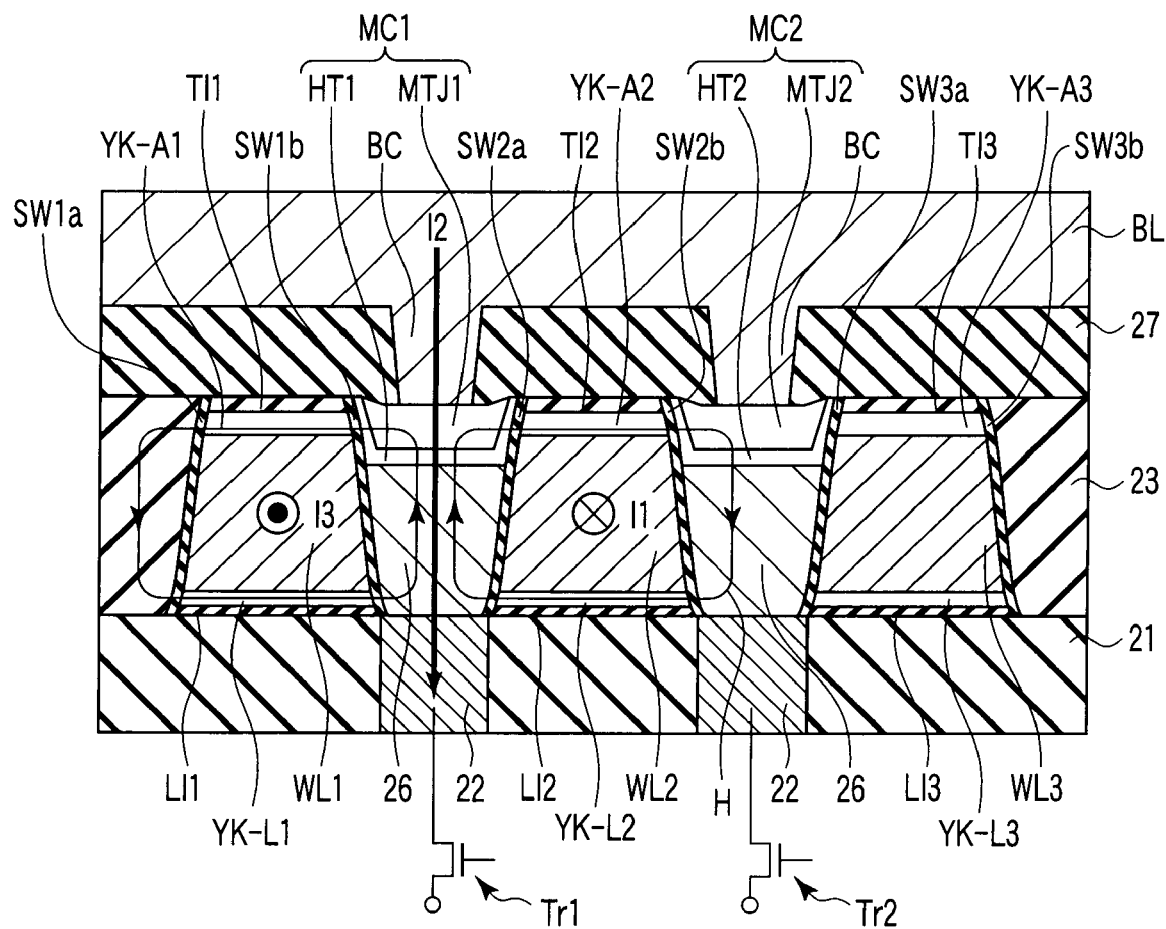
F I G. 16

MAGNETIC RANDOM ACCESS MEMORY, AND WRITE METHOD AND MANUFACTURING METHOD OF THE SAME

CROSS-REFERENCE TO RELATED APPLICATIONS

This application is based upon and claims the benefit of priority from prior Japanese Patent Application No. 2007-060693, filed Mar. 9, 2007, the entire contents of which are incorporated herein by reference.

BACKGROUND OF THE INVENTION

1. Field of the Invention

The present invention relates to a magnetic random access memory including a memory cell having a magnetoresistive effect element and heater layer, and a write method and manufacturing method of the same.

2. Description of the Related Art

Recently, a number of memories that store information by new principles have been proposed. An MRAM (Magnetic Random Access Memory) using the TMR (Tunneling Magneto Resistive) effect is one of these memories.

A memory cell of this MRAM comprises, e.g., an MTJ (Magnetic Tunnel Junction) element and switching element. Letting F (Feature size) be the short side of the MTJ element and 2F be its long side, the cell size is $12F^2$ when a MOSFET is used as the switching element. This cell size is larger than that of a DRAM or flash memory. Therefore, a method that forms a bit line for easy axis write below the MTJ element and forms a lower electrode and the fringe of this contact in self-alignment is sometimes used. In this case, the cell size decreases to $10F^2$, but this cell size is still unsatisfactory for micropatterning.

To implement a 256-Mbit class, large-capacity MRAM, it is necessary to decrease the cell area to about 1 $\mu m^2$ or less and downsize a peripheral circuit of the cell. To decrease the cell area to about 1 $\mu m^2$ or less, F of the cell design rule must be decreased to about 0.13 $\mu m$. To miniaturize the peripheral circuit of the cell and decrease the ratio occupied by the cell to about 0.6, it is essential to decrease the value of a cell write current to about 1 mA or less. When the cell width F is about 0.4 $\mu m$, however, even the smallest write current value of the presently reported MTJ elements is about 8 to 10 mA.

Note that pieces of prior art reference information related to the present invention are as follows.

[Non-patent Reference 1] M. Durlam et al., A low power 1 Mbit MRAM based on 1T1MTJ bit cell integrated with Copper Interconnects, 2002 Symposium on VLSI Circuits Digest of Technical Papers

[Non-patent Reference 2] Ikeda et al., "GMR Film and TMR Film Using GdFe Alloy Perpendicular Magnetization Film", Journal of Japan Applied Magnetics Vol. 24, No. 4-2, 2000, pp. 563-566 [Non-patent Reference 3] N. Nishimura et al., "Magnetic tunnel junction device with perpendicular magnetic films for high-density magnetic random access memory", JOURNAL OF APPLIED PHYSICS, VOLUME 91, NUMBER 8, 15 Apr., 2002

BRIEF SUMMARY OF THE INVENTION

A magnetic random access memory according to the first aspect of the present invention comprising a bit line running in a first direction, a first word line running in a second direction different from the first direction, and a memory element having a magnetoresistive effect element including a fixed layer having a fixed magnetization direction, a recording layer having a reversible magnetization direction, and a nonmagnetic layer formed between the fixed layer and the recording layer, the magnetization directions in the fixed layer and the recording layer being perpendicular to a film surface, and a heater layer in contact with the magnetoresistive effect element, the memory element being connected to the bit line, and formed to oppose a side surface of the first word line such that the memory element is insulated from the first word line.

A write method of a magnetic random access memory according to the second aspect of the present invention including a bit line running in a first direction, a first word line running in a second direction different from the first direction, and a memory element having a magnetoresistive effect element including a fixed layer having a fixed magnetization direction, a recording layer having a reversible magnetization direction, and a nonmagnetic layer formed between the fixed layer and the recording layer, the magnetization directions in the fixed layer and the recording layer being perpendicular to a film surface, and a heater layer in contact with the magnetoresistive effect element, the memory element being connected to the bit line, and formed to oppose a side surface of the first word line such that the memory element is insulated from the first word line, the method comprising a first step of heating the heater layer by supplying a first write current to the memory element, and heating the magnetoresistive effect element by heat of the heater layer, thereby decreasing a magnetization reversal threshold value of the magnetoresistive effect element, and a second step of supplying a second write current to the first word line, and reversing the magnetization direction in the recording layer by a magnetic field generated by the second write current.

A magnetic random access memory manufacturing method according to the third aspect of the present invention comprising forming a first interlayer dielectric film, forming a first contact in the first interlayer dielectric film, forming a first word line and a second word line on the first interlayer dielectric film, depositing a second interlayer dielectric film around the first word line and the second word line, removing the second interlayer dielectric film between the first word line and the second word line, thereby forming a trench which exposes the first contact, forming a memory element having a magnetoresistive effect element and a heater layer in the trench, and forming a bit line connecting to the memory element.

BRIEF DESCRIPTION OF THE SEVERAL VIEWS OF THE DRAWING

FIG. 16 is a sectional view for explaining a write operation according to the fifth embodiment of the present invention.

DETAILED DESCRIPTION OF THE INVENTION

Figure 1:
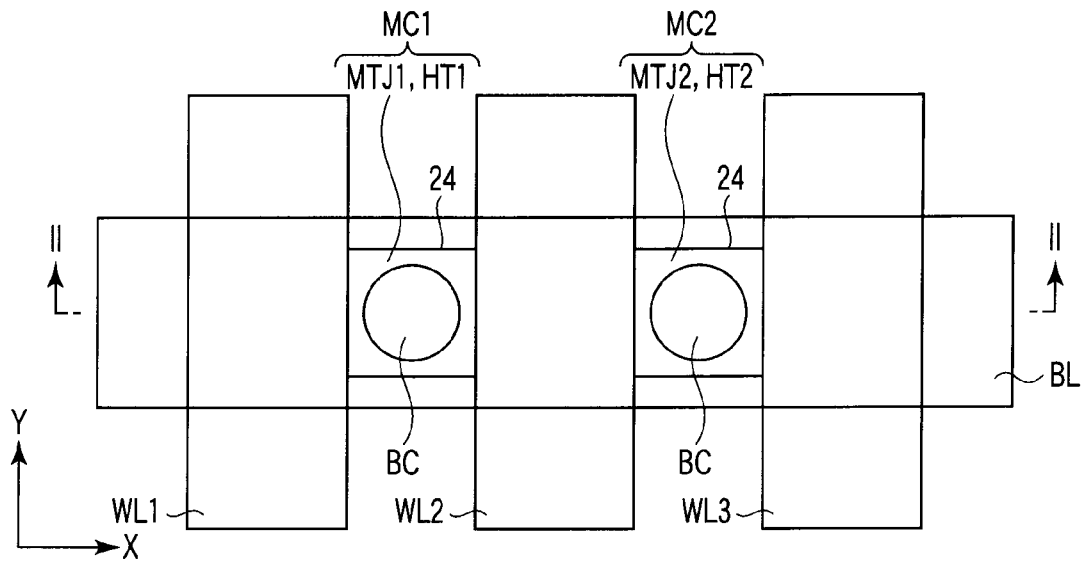
FIG. 1 is a plan view of a magnetic random access memory according to the first embodiment of the present invention.

Embodiments of the present invention will be explained below with reference to the accompanying drawing. In the following explanation, the same reference numerals denote the same parts throughout the drawing.

[1] First Embodiment

[1-1] Structure

Figure 2:
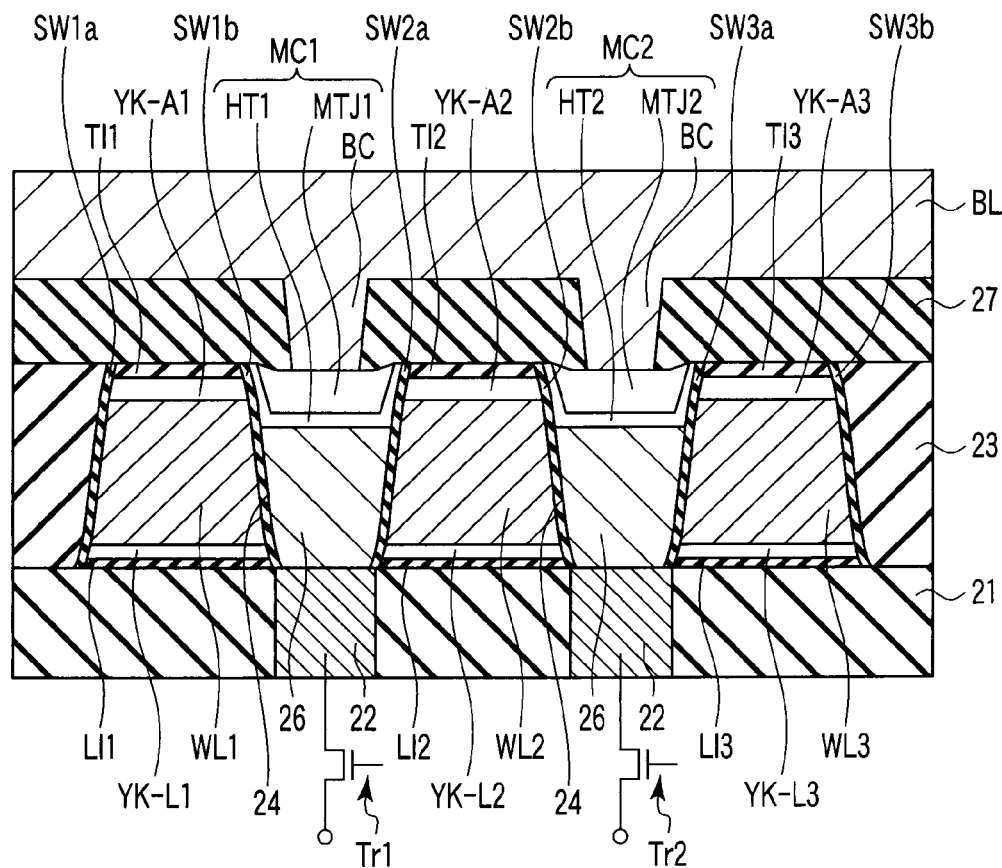
FIG. 2 is a sectional view taken along a line II-II in FIG. 1.

FIG. 1 is a plan view of a magnetic random access memory according to the first embodiment of the present invention. FIG. 2 is a sectional view taken along a line II-II in FIG. 1. The magnetic random access memory according to the first embodiment will be explained below. The explanation will be made by particularly taking a memory element MC1 and word line WL2 as examples.

As shown in FIGS. 1 and 2, a bit line BL runs in the X direction, and a word line WL1, the word line WL2, and a word line WL3 run in the Y direction (e.g., a direction perpendicular to the X direction). The word lines WL1, WL2, and WL3 run parallel and apart from each other. The word lines WL1, WL2, and WL3 are made of a low-resistance metal material such as AlCu or Cu.

The memory element MC1 and a memory element MC2 are connected to the bit line BL. The memory element MC1 is sandwiched between the word lines WL1 and WL2. The memory element MC2 is sandwiched between the word lines WL2 and WL3.

The memory element MC1 has an MTJ element MTJ1 and heater layer HT1. The MTJ element MTJ1 and heater layer HT1 form a stacked structure in which they are in direct contact with each other. The word lines WL1 and WL2 are arranged to oppose the side surfaces of the memory element MC1.

In this embodiment, the MTJ element MTJ1 is stacked on the heater layer HT1. Therefore, the MTJ element MTJ1 is connected to the bit line BL via a bit line contact BC. On the other hand, the heater layer HT1 is connected to a transistor (e.g., a MOSFET) Tr1 via contacts 26 and 22.

The heater layer HT1 is formed not only on the contact 26 but also on the side surfaces of a trench 24. Accordingly, the section of the heater layer HT1 has a recessed shape. This recessed shape has an opening wider than the bottom surface. The MTJ element MTJ1 is formed to fill the recess of the heater layer HT1. The section of the MTJ element MTJ1 has an inverse trapezoidal shape that widens from the bottom surface to the upper surface. Note that the heater layer HT1 and MTJ element MTJ1 may also be stacked in the reverse order. In this case, the section of the MTJ element MTJ1 has a recessed shape, and that of the heater layer HT1 has an inverse trapezoidal shape. The sectional shape of the MTJ element MTJ1 or heater layer HT1 is desirably a somewhat inverse trapezoid in order to improve the processability, but may also be a rectangle or the like.

The contact 26 is formed to fill the lower portion of the trench 24 between the word lines WL1 and WL2. For example, the section of the word lines WL1 and WL2 has a trapezoidal shape that narrows from the bottom surface to the upper surface, and the section of the contact 26 has an inverse trapezoidal shape that widens from the bottom surface to the upper surface. Note that the sections of the contact 26 and word lines WL1 and WL2 are desirably somewhat trapezoidal shapes in order to improve the processability, but may also be rectangles or the like. The contact 26 can be formed by a conductive material or soft magnetic material. In the latter case, the yoke effect can be improved.

A lower yoke layer YK-L2 is formed on the lower surface of the word line WL2, and an upper yoke layer YK-A2 is formed on the upper surface of the word line WL2. The yoke layers YK-L2 and YK-A2 are made of a soft magnetic material such as NiFe in order to converge a magnetic field generated by the word line WL2. In this embodiment, the yoke layers are formed on only the upper and lower surfaces of the word line WL2, and not formed on the side surfaces of the word line WL2. This is so in order to confine no magnetic field in the word line WL, and in order for the contact 26 itself made of a soft magnetic material to function as a portion of the yoke layers and form a closed magnetic path as a whole, thereby maximizing the efficiency of the application of the magnetic field to the MTJ element.

A lower insulating film LI2 is formed below the lower yoke layer YK-L2, and an upper insulating film TI2 is formed on the upper yoke layer YK-A2. Sidewall insulating films SW2*a* and SW2*b* are formed on the side surfaces of a stacked structure including the lower insulating film LI2, lower yoke layer YK-L2, word line WL2, upper yoke layer YK-A2, and upper insulating film TI2.

A sidewall insulating film SW1*b*, which opposes the memory element MC1, of the word line WL1 and the sidewall insulating film SW2*a*, which opposes the memory element MC1, of the word line WL2 are in direct contact with the contact 26 and memory element MC1 (in this embodiment, the heater layer HT1) between the word lines WL1 and WL2. The sidewall insulating films SW1*b* and SW2*a* insulate the memory element MC1 from the word lines WL1 and WL2.

A film thickness A of the upper insulating film TI2 is desirably larger than a film thickness B of the sidewall insulating films SW2*a* and SW2*b*. This is so in order to allow the upper insulating film TI2 to well prevent etching for forming the trench 24 from etching away the upper end portions and the like of the word line WL2 and upper yoke layer YK-A2.

The relationship between the film thickness A of the upper insulating film TI2 and the film thickness B of the sidewall insulating films SW2*a* and SW2*b* desirably satisfies, e.g., A×⅓≦B≦A×½. The lower limit is mainly defined on the basis of the etching selectivity during the formation of the trench 24 and the insulation breakdown voltage. The upper limit is defined to ensure a minimum width of the trench 24 (particularly, the side width of the trench 24) when etching is performed during the formation of the trench 24.

The film thickness of the sidewall insulating films SW2a and SW2b is, e.g., about 10 to 50 nm. The film thickness of the sidewall insulating films SW2a and SW2b is adjusted by taking account of damage absorption during etching and the dielectric breakdown voltage.

The upper insulating film TI2 and sidewall insulating films SW2a and SW2b are preferably made of the same material in order to facilitate the process.

A first stacked portion including a lower insulating film LI1, a lower yoke layer YK-L1, the word line WL1, an upper yoke layer YK-A1, and an upper insulating film TI1, a second stacked portion including the lower insulating film LI2, lower yoke layer YK-L2, word line WL2, upper yoke layer YK-A2, and upper insulating film TI2, and a third stacked portion including a lower insulating film LI3, a lower yoke layer YK-L3, the word line WL3, an upper yoke layer YK-A3, and an upper insulating film TI3 are arranged on the same interlayer dielectric film 21.

The first to third stacked portions correspond to the two memory cells MC1 and MC2. The side surface of the first stacked portion away from the side surface opposing the memory element MC1 and the side surface of the third stacked portion away from the side surface opposing the memory element MC2 do no oppose any memory element, and are covered with an interlayer dielectric film 23. The upper surface of the interlayer dielectric film 23 is leveled with the upper surfaces of the upper insulating films TI1, TI2, and TI3, the MTJ element MTJ1, and an MTJ element MTJ2.

Note that in order to prevent the adverse effect of mutual diffusion of the soft magnetic materials, a barrier metal film made of Ta or TaN may also be formed in contact with the yoke layer. More specifically, it is possible to from barrier metal films between the word line WL2 and lower yoke layer YK-L2, and between the word line WL2 and upper yoke layer YK-A2. Barrier metal films may also be formed between the lower yoke layer YK-L2 and lower insulating film LI2, and between the upper yoke layer YK-A2 and upper insulating film TI2.

[1-2] Manufacturing Method

FIGS. 3A to 3F are sectional views of the manufacturing steps of the magnetic random access memory according to the first embodiment of the present invention. The manufacturing method of the magnetic random access memory according to the first embodiment will be explained below.

Figure 3A:
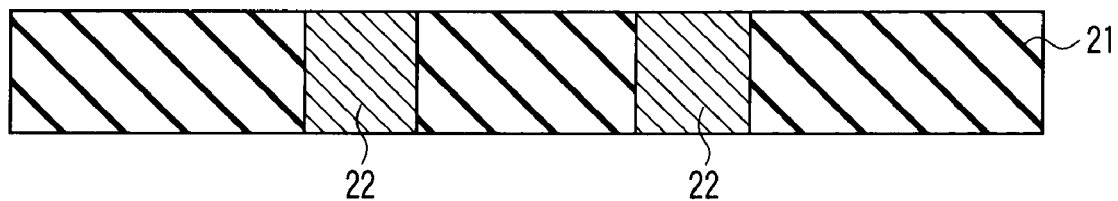
FIGS. 3A to 3F are sectional views showing the manufacturing steps of the magnetic random access memory according to the first embodiment of the present invention.

First, as shown in FIG. 3A, transistors (not shown) are formed on an impurity-doped silicon substrate (not shown) by using the conventional LSI process. Then, an interlayer dielectric film 21 is deposited on the transistors and planarized. An example of the interlayer dielectric film 21 is an $SiO_2$ film using BPSG (Boron Phosphorous Silicate Glass) or TEOS (Tetra Ethyl Ortho Silicate). Subsequently, contact holes for exposing source/drain regions of the transistors are formed in the interlayer dielectric film 21 by using the conventional RIE (Reactive Ion Etching) process. A barrier metal film (not shown) such as Ti or TiN is formed in the contact holes. A conductive material made of W or the like is formed on the barrier metal film by CVD (Chemical Vapor Deposition) or the like. After that, the interlayer dielectric film 21 is exposed by planarizing the barrier metal film and conductive material, thereby forming contacts 22 connecting to the source/drain regions of the transistors.

Figure 3B:
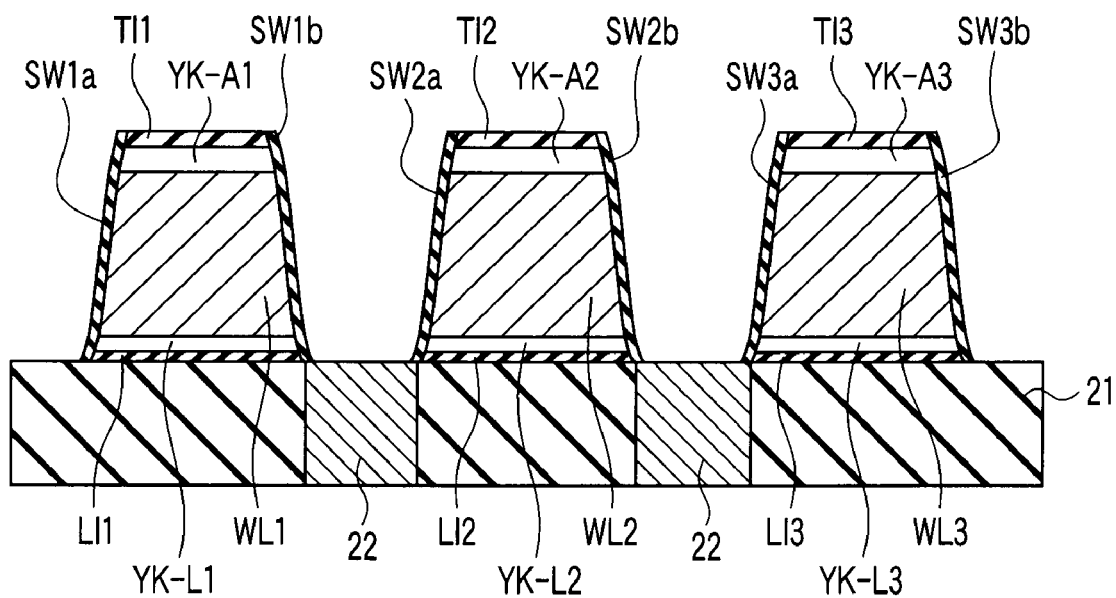

Then, as shown in FIG. 3B, a lower insulating film L1, lower yoke layer YK-L, word line material WL, upper yoke layer YK-A, and upper insulating film TI are sequentially deposited on the interlayer dielectric film 21 and contacts 22. Examples of the stacked materials of the lower insulating film L1/lower yoke layer YK-L/word line material WL/upper yoke layer YK-A/upper insulating film TI are $SiO_x$/NiFe/AlCu/NiFe/$SiO_x$.

Subsequently, a resist (not shown) for a word line pattern is formed on the upper insulating film TI by the conventional lithography process. This resist is used to process the stacked materials directly or by hard mask transfer by using an etching technique such as RIE, thereby forming stacked portions of word lines WL1, WL2, and WL3.

A sidewall insulating film SW such as $SiO_x$ or SiN is deposited on upper insulating films TI1, TI2, and TI3, the interlayer dielectric film 21, and the contacts 22, and then removed to leave sidewall insulating films SW1a, SW1b, SW2a, SW2b, SW3a, and SW3b behind on only the side surfaces of the stacked portions of the word lines WL1, WL2, and WL3.

Note that SiN or a stacked film of $SiO_x$/SiN may also be used instead of $SiO_x$ as the material of the word lines WL. It is also possible to insert a barrier metal such as Ta or TaN between NiFe and $SiO_x$ and between NiFe and AlCu. Cu or an alloy material such as doped-poly-Si or WSi may also be used instead of AlCu.

Figure 3C:
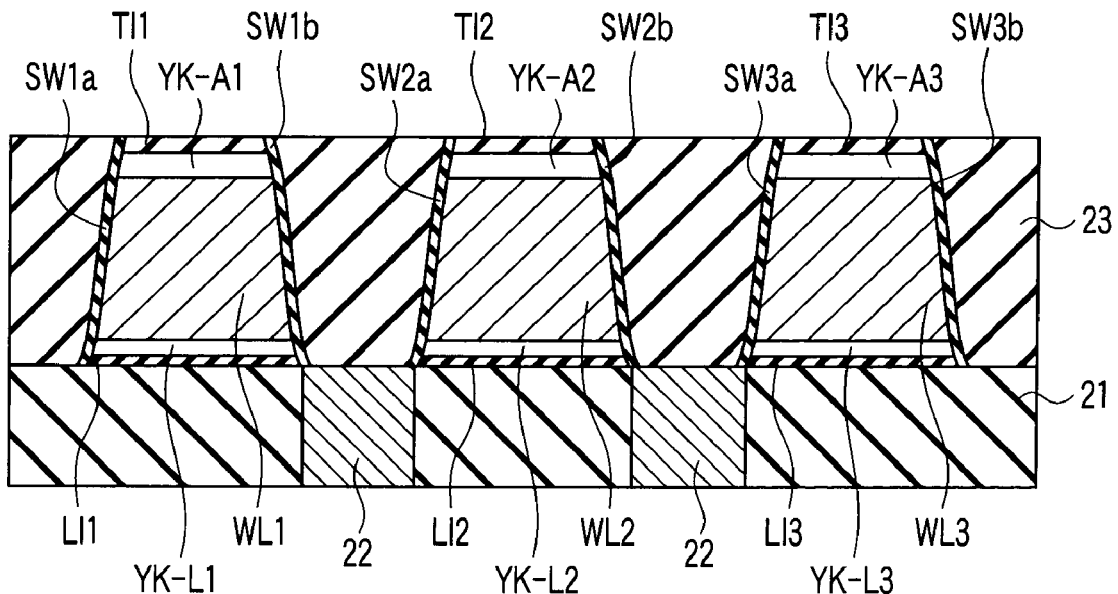

As shown in FIG. 3C, an interlayer dielectric film 23 such as an $SiO_x$ film is deposited on the upper insulating films TI1, TI2, and TI3, interlayer dielectric film 21, and contacts 22 by plasma CVD or HDP. After that, the interlayer dielectric film 23 is planarized by CMP (Chemical Mechanical Polish) or etch back, thereby exposing the upper insulating films TI1, TI2, and TI3.

Figure 3D:
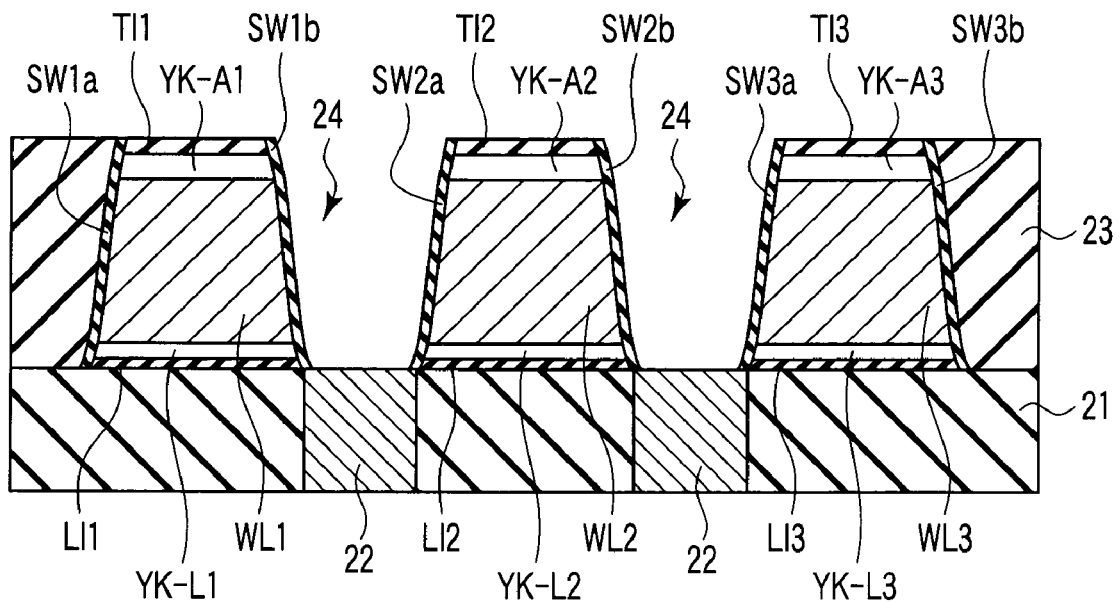

As shown in FIG. 3D, a photoresist mask (not shown) exposing only prospective cell portions is formed by photolithography. This mask is used to remove the interlayer dielectric film 23 by anisotropic etching such as RIE, thereby forming trenches 24 that expose the contacts 22.

Figure 3E:
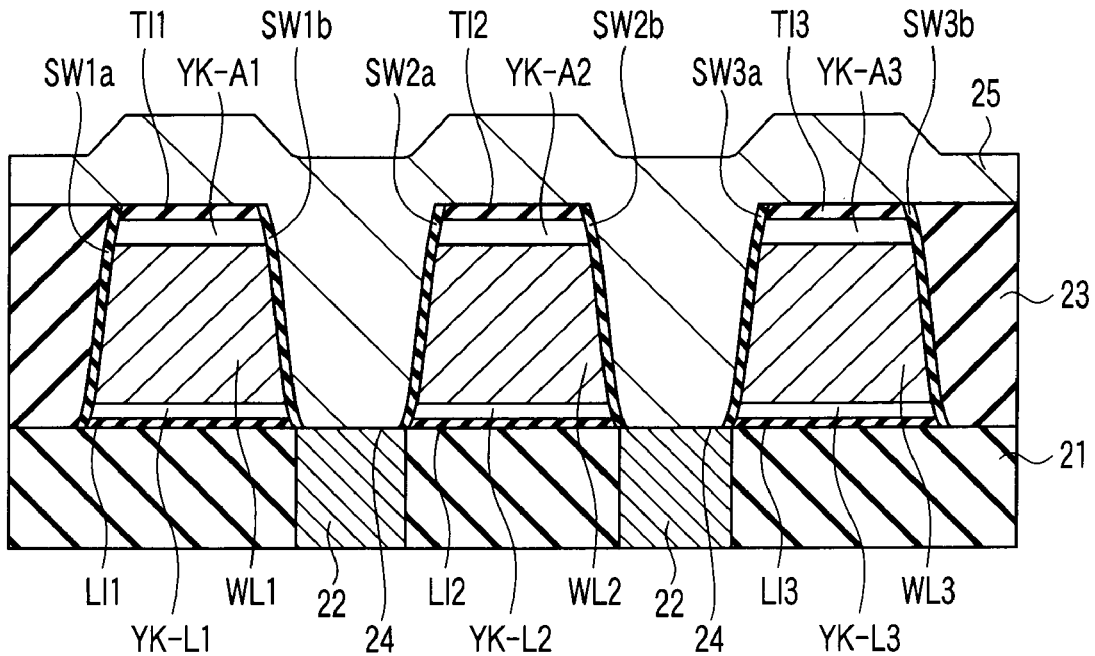

As shown in FIG. 3E, a contact material 25 is deposited on the entire surface and buried in the trenches 24. Examples of the contact material 25 are a conductive material of doped-poly-Si, metal materials such as Ta and TiN, and conductive soft magnetic materials such as NiFe.

Figure 3F:
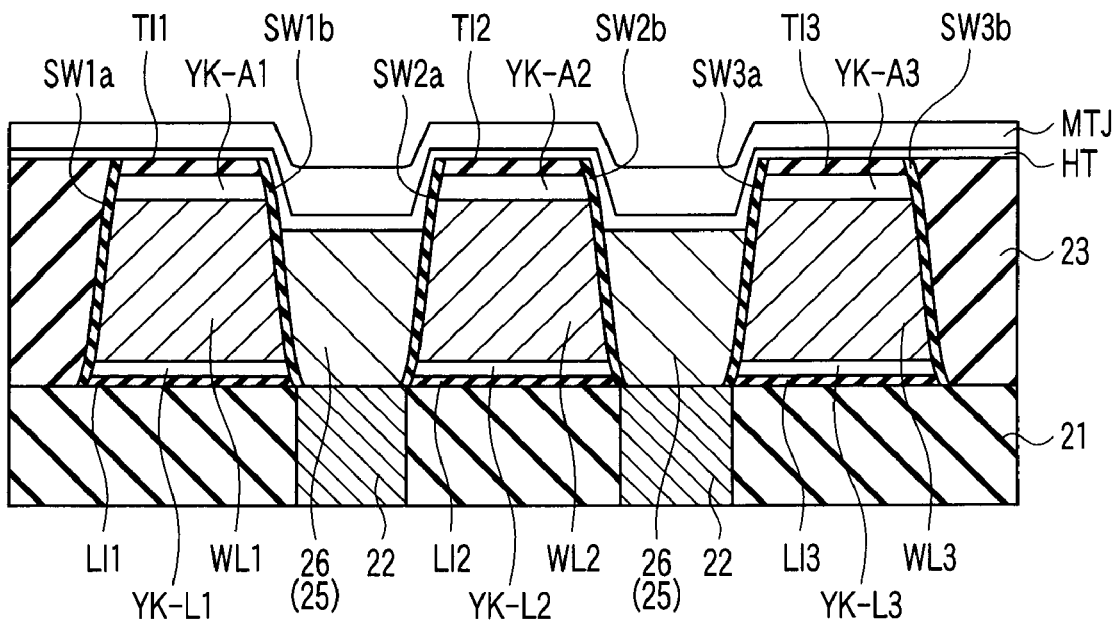

As shown in FIG. 3F, the contact material 25 is etched back by CMP and an anisotropic etching technique such as RIE, thereby forming contacts 26 leveled with a desired height of the word lines WL1, WL2, and WL3. Subsequently, an MTJ material MTJ and heater material HT are deposited on the contacts 26, upper insulating films TI1, TI2, and TI3, and interlayer dielectric film 23.

Examples of the MTJ material MTJ are as follows. A recording layer is formed by using a soft magnetic material such as NiFe. A tunnel barrier layer is formed by using an insulating material such as $AlO_x$. A fixed layer is formed by using a soft magnetic material such as CoFe or a stacked ferri-structure of soft magnetic/nonmagnetic/soft magnetic such as CoFe/Ru/CoFe on an antiferromagnetic layer such as PtMn.

Subsequently, as shown in FIG. 2, the MTJ material MTJ and heater material HT are removed from the upper surfaces of the upper insulating films TI1, TI2, and TI3 and interlayer dielectric film 23 by using CMP. In this way, memory elements MC1 and MC2 are formed in only the trenches 24.

An interlayer dielectric film 27 is deposited on the memory elements MC1 and MC2, upper insulating films TI1, TI2, and TI3, and interlayer dielectric film 23, and planarized. Contact holes are formed in the interlayer dielectric film 27 by using the conventional lithography process and RIE technique. A barrier metal film (not shown) and metal material are deposited in the contact holes and on the interlayer dielectric film 27, and planarized, thereby forming bit line contacts BC. A metal material is then deposited on the bit line contacts BC and interlayer dielectric film 27, and processed by using the conventional lithography process and RIE technique, thereby forming a bit line BL. Examples of the metal material of the bit line BL are AlCu and Ti/AlCu/Ti.

[1-3] Memory Element

Figure 4:
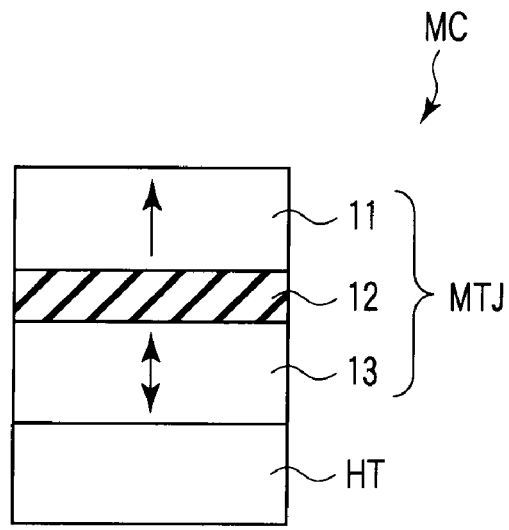
FIG. 4 is a schematic sectional view of a memory element according to the first embodiment of the present invention.
Figure 5A:
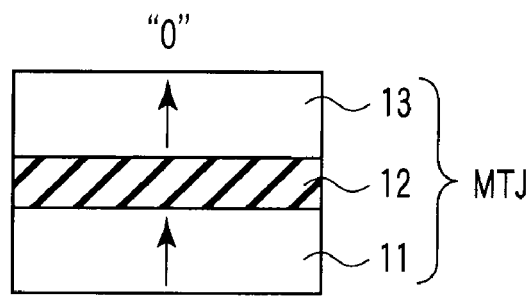
FIGS. 5A and 5B are schematic sectional views of an MTJ element in states "0" and "1" according to the first embodiment of the present invention.
Figure 5B:
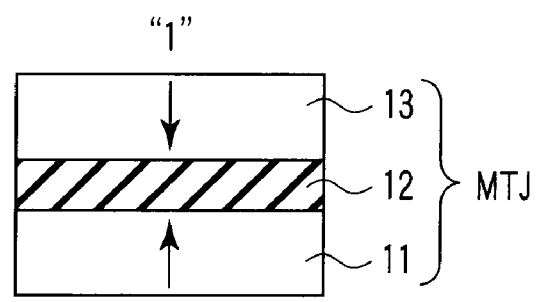

FIG. 4 is a schematic sectional view of the memory element according to the first embodiment of the present invention. FIGS. 5A and 5B are schematic sectional views of the MTJ element in states "0" and "1" according to the first embodiment of the present invention. The memory element according to the first embodiment will be explained below.

As shown in FIG. 4, a memory element MC has an MTJ element MTJ and heater layer HT. The MTJ element MTJ and heater layer HT are desirably in direct contact with each other. In addition, the heater layer HT is preferably in direct contact with a recording layer 13 in order to increase the thermal efficiency.

The MTJ element MTJ has a fixed layer (pinned layer) 11 having a fixed magnetization direction, the recording layer (free layer) 13 having a reversible magnetization direction, and a nonmagnetic layer (tunnel barrier layer) 12 formed between the fixed layer 11 and recording layer 13. The magnetization directions in the fixed layer 11 and recording layer 13 are perpendicular to the film surfaces. That is, this MTJ element MTJ is a so-called perpendicular magnetization type MTJ element.

As shown in FIG. 5A, the tunnel resistance of the nonmagnetic layer 12 is lowest when the magnetization directions in the fixed layer 11 and recording layer 13 of the MTJ element MTJ are parallel (the same). Assume that this state is state "0". On the other hand, as shown in FIG. 5B, the tunnel resistance of the nonmagnetic layer 12 is highest when the magnetization directions in the fixed layer 11 and recording layer 13 of the MTJ element MTJ are antiparallel (opposite). Assume that this state is state "1".

[1-4] Write Operation

Figure 6:
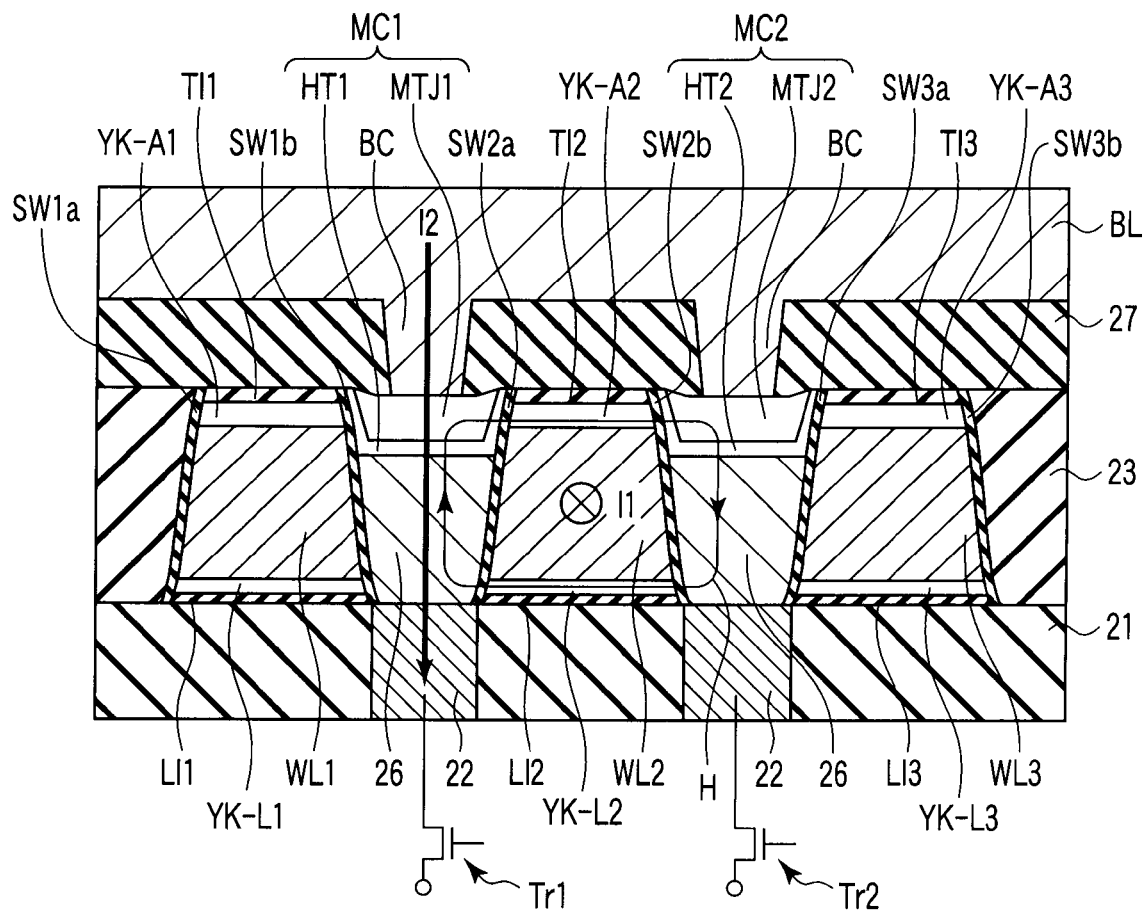
FIG. 6 is a view for explaining the principle of a write method according to the first embodiment of the present invention.
Figure 7:
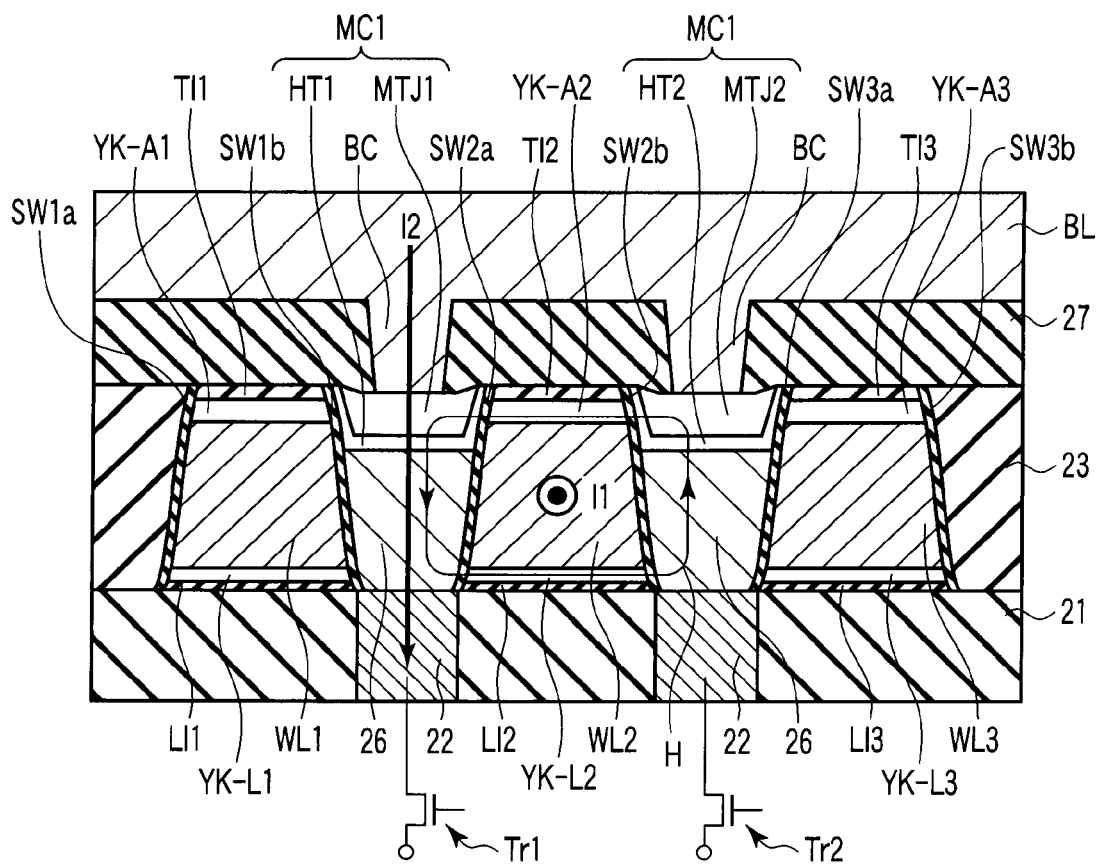
FIG. 7 is a view for explaining the principle of the write method according to the first embodiment of the present invention.

FIGS. 6 and 7 are views for explaining the principle of a write operation according to the first embodiment of the present invention. A thermally assisted write operation will be explained below by taking the case where the memory element MC1 is selected as an example.

First, a pair of the bit line BL and write word line WL2 corresponding to the selected memory element MC1 is selected via a decoder or the like. On the other hand, although not shown, a read word line corresponding to the selected bit line BL and connected to, e.g., the gate electrode of the cell selection transistor Tr1 is also selected via a decoder or the like in accordance with the write word line WL2. Then, the first and second steps described below are performed. Note that the order of the first and second steps can be set such that the second step is performed after the first step, the first step is performed after the second step, or the first and second steps are simultaneously performed.

In the first step, a write current I1 is supplied to the word line WL2 corresponding to the selected memory element MC1. Since the word line WL2 has the yoke layers YK-A2 and YK-L2, a closed magnetic loop is formed around the word line WL2. As a consequence, a converged current magnetic field H is applied to the memory element MC1.

In the second step, a bit line current I2 is supplied from the selected bit line BL to the sink side (not shown) via the channel of the selected transistor Tr1. The bit line current I2 heats the heater layer HT1, and the heater layer HT1 heats the recording layer of the adjacent MTJ element MTJ1. This decreases the coercive force of the MTJ element MTJ1.

In the write operation in the first and second steps described above, the current magnetic field H in the first step is also applied to the unselected memory element MC2 on the right side of the write word line WL2. However, while the bit line current I2 has decreased the coercive force of the selected memory element MC1, the coercive force of the unselected memory element MC2 or another memory element connected to a different bit line has not decreased because the bit line current I2 does not flow. Therefore, magnetization in only a selected cell can be reversed by presetting, as the write current I1, a value that reverses only magnetization in a recording layer whose coercive force has decreased.

As described above, the bit line current I2 is supplied to the selected memory element MC1, and the magnetization reversal threshold value is decreased by the heat of the heater layer HT1. This makes it possible to write data in only the selected cell by the magnetic field H generated by the write current I1 having a predetermined value.

Note that the magnetization directions in the fixed layer and recording layer are desirably perpendicular to the film surfaces. That is, the magnetic field H generated by the write current I1 is applied parallel or antiparallel to the magnetization direction.

Data "0" and "1" can be selectively written in a cell by changing the direction of the electric current I1 to be supplied to the write word line WL2, thereby reversing the direction of the magnetic field H to be applied to the recording layer having a perpendicular magnetization direction. That is, when writing one of data "0" and "1", as shown in FIG. 6, the electric current I1 flowing into the drawing surface is supplied to the word line WL2 to generate a clockwise magnetic field H, thereby applying an upward magnetic field to the recording layer of the memory element MC1. When writing the other one of data "0" and "1", as shown in FIG. 7, the electric current I1 flowing out of the drawing surface is supplied to the word line WL2 to generate a counterclockwise magnetic field H, thereby applying a downward magnetic field to the recording layer of the memory element MC1.

Note that the bit line current I2 need not always flow from the bit line BL to the transistor Tr1, and may also flow from the transistor Tr1 to the bit line BL.

[1-5] Read Operation

The read operation of the magnetic random access memory according to the first embodiment of the present invention uses the magnetoresistive effect.

A bit line BL and read word line corresponding to a selected cell are selected, and a read selection transistor Tr is turned on. A read current is supplied to the MTJ element MTJ by applying a voltage to the bit line BL and a source line. The resistance value of the MTJ element MTJ is read out on the basis of this read current, and whether the recorded data is "0" or "1" is determined by an amplifying operation via a sense amplifier.

Note that in this read operation, it is possible to read out a current value by applying a constant voltage, or read out a voltage value by supplying a constant electric current.

[1-6] MTJ Element

When adopting the thermally assisted write method of this embodiment, the MTJ element is preferably given the characteristics that (first) the ratio of the coercive force when thermal assist is added to that when no thermal assist is added is as high as possible, and (second) the coercive force abruptly changes from a specific temperature. This is so in order to ensure a temperature rise caused by heat conduction from a thermally assisted adjacent bit line, and a thermal agitation resistance in the process of cooling the bit line having undergone thermally assisted write.

Techniques for achieving these characteristics will be explained below.

The basic structure of the MTJ element is a structure in which the fixed layer 11 and recording layer 13 sandwich the tunnel barrier layer (insulating layer) 12.

First, the fixed layer 11 is formed by using a magnetic material having a high coercive force, and the recording layer 13 is formed by using a magnetic material that makes the coercive force during the write operation smaller than that of the fixed layer 11.

Note that the recording layer 13 may also be made of a plurality of magnetic materials in order to increase the ratio of the coercive force when thermal assist is added to that when no thermal assist is added.

Then, a functional layer 50 may also be additionally formed adjacent to the recording layer 13 in order to achieve the characteristic that the coercive force abruptly changes from a specific temperature.

Figures 8A, 8B:
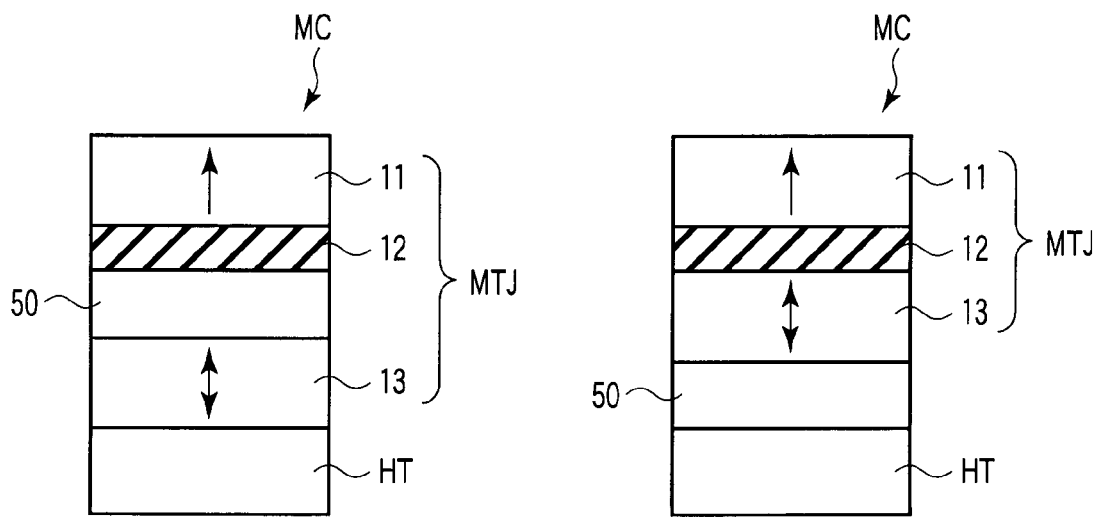
FIGS. 8A and 8B are schematic sectional views of a memory element including a functional layer according to the first embodiment of the present invention.

As shown in FIG. 8A, the functional layer 50 can be formed between the tunnel barrier layer 12 and recording layer 13. As shown in FIG. 8B, the functional layer 50 is more preferably formed on the surface of the recording layer 13 away from the surface opposing the tunnel barrier layer 12. The functional layer 50 is desirably formed between the recording layer 13 and heater layer HT.

The functional layer 50 is made of a material that changes its properties from paramagnetism to ferromagnetism, or from antiferromagnetism to ferromagnetism, from a specific temperature Tf.

The specific temperature Tf must be higher than a normal temperature Tn, and secure a sufficient margin with respect to the normal temperature Tn. Also, the specific temperature Tf must be lower than the temperature of the MTJ element during the write operation, i.e., a recording temperature Tw, and secure a sufficient margin with respect to the recording temperature Tw.

Examples of a material showing the antiferromagnetism-ferromagnetism transition are Fe—Rh; alloys formed by adding additives such as Co, Ni, Pd, Pt, and Ir to Fe—Rh; and Mn—Rh, Mn—Cr—Sb, Mn—V—Sb, Mn—Co—Sb, Mn—Cu—Sb, Mn—Zn—Sb, Mn—Ge—Sb, and Mn—As—Sb. From these materials, an optimum material congenial to the recording temperature Tw is selected.

A ferrimagnetic material having a compensation temperature (compensation point) Tcomp near the normal temperature may also be used as the functional layer 50. As a material showing ferrimagnetism, a thin film of a ferrimagnetic material can be used. Examples of the material are thin films of amorphous rare earth metal-transition metal alloys such as Tb—Fe, Tb—Fe—Co, Tb—Co, Gd—Tb—Fe—Co, Gd—Dy—Fe—Co, Nd—Fe—Co, and Nd—Tb—Fe—Co, and ordered alloys such as $CrPt_3$.

Ferrites such as $MFe_2O_4$ (M is one of Mn, Fe, Co, Ni, Co, Mg, Zn, and Cd) and $LiFe_5O_8$ and multi-component ferrites are also known as ferrimagnetic materials. Of these materials, a material having a compensation point near the normal temperature is applied as the functional layer 50 (ferrimagnetic material) for use in the example of the present invention.

The functional layer 50 is formed in contact with the recording layer 13. Therefore, the ferromagnetic exchange coupling between the functional layer 50 and recording layer 13 is achieved by, e.g., continuously forming these two layers in a vacuum by sputtering.

When writing data in the example of the present invention, the temperature of the recording layer 13 of a selected MTJ element is raised to the recording temperature Tw by thermal assist, thereby temporarily decreasing the coercive force (magnetic anisotropic energy) of the recording layer 13. To prevent a write error, an unselected MTJ element is held at the normal temperature Tn to keep the coercive force of the recording layer 13 at a high value.

In operations other than the write operation, a high coercive force is assured by holding the MTJ element at the normal temperature Tn in order to prevent deterioration of the MTJ element by thermal fluctuation.

[A] A magnetic material having a high coercive force is made of a material having a high magnetic anisotropic energy density of $1 \times 10^6$ erg/cc or more.

Examples of the material will be explained below.

(1) EXAMPLE 1

"A material made of an alloy containing at least one of Fe (iron), Co (cobalt), and Ni (nickel), and at least one of Cr (chromium), Pt (platinum), and Pd (palladium)"

Examples of an ordered alloy are Fe(50)Pt(50), Fe(50)Pd (50), and Co(50)Pt(50). Examples of a random alloy are a CoCr alloy, CoPt alloy, CoCrPt alloy, CoCrPtTa alloy, and CoCrNb alloy.

(2) EXAMPLE 2

"A material having a structure obtained by alternately stacking at least one of Fe, Co, and Ni or an alloy containing one of Fe, Co, and Ni, and one of Pd and Pt or an alloy containing one of Pd and Pt"

Examples are a Co/Pt artificial lattice, Co/Pd artificial lattice, and CoCr/Pt artificial lattice. When the Co/Pt artificial lattice or Co/Pd artificial lattice is used, it is possible to obtain a high resistance change ratio (MR ratio) of about 40%.

(3) EXAMPLE 3

"An amorphous alloy containing at least one rare earth metal such as Tb (terbium), Dy (dysprosium), or Gd (gadolinium), and at least one transition metal"

Examples are TbFe, TbCo, TbFeCo, DyTbFeCo, and GdTbCo.

[B] The recording layer 13 can be made of a magnetic material having a high coercive force as described above, and can also be made of a magnetic material given a magnetic anisotropy energy density lower than that of the high-coercive-force magnetic material as described above by adjusting the composition ratio, adding an impurity, or adjusting the thickness.

Examples of the material will be explained below.

(1) EXAMPLE 1

"A material obtained by adding an impurity to an alloy containing at least one of Fe, Co, and Ni and at least one of Cr, Pt, and Pd"

An example of an ordered alloy is a material given a low magnetic anisotropic energy density by adding an impurity such as Cu, Cr, or Ag to Fe(50)Pt(50), Fe(50)Pd(50), or Co(50)Pt(50). An example of a random alloy is a material given a low magnetic anisotropic energy density by increasing the ratio of nonmagnetic elements in a CoCr alloy, CoPt alloy, CoCrPt alloy, CoCrPtTa alloy, or CoCrNb alloy.

(2) EXAMPLE 2

"A material which has a structure obtained by alternately stacking at least one of Fe, Co, and Ni or an alloy containing one of Fe, Co, and Ni, and one of Pd and Pt or an alloy containing one of Pd and Pt, and in which the thickness of a layer made of the former element or alloy or the thickness of a layer made of the latter element or alloy is adjusted"

The thickness of at least one of Fe, Co, and Ni or the alloy containing one of Fe, Co, and Ni has an optimum value, and the thickness of one of Pd and Pt or the alloy containing one of Pd and Pt has an optimum value. As the thicknesses depart from these optimum values, the magnetic anisotropic energy density gradually lowers.

(3) EXAMPLE 3

"A material obtained by adjusting the composition ratio of an amorphous alloy containing at least one rare earth metal such as Tb (terbium), Dy (dysprosium), or Gd (gadolinium), and at least one transition metal"

An example is a material given a low magnetic anisotropic energy density by adjusting the composition ratio of an amorphous alloy such as TbFe, TbCo, TbFeCo, DyTbFeCo, or GdTbCo.

[C] When forming the MTJ element on the yoke material (soft magnetic material), a buffer layer having a function of preventing the diffusion of atoms and a function of preventing the exchange coupling of the yoke material and MTJ element is formed between the yoke layer and MTJ element. An example of the buffer layer is a conductive layer made of Ta, TiN, or TaN.

When, e.g., the Co/Pt artificial lattice is used as the recording layer 13, the coercive force of the MTJ element can be adjusted by adjusting the thicknesses of Co and Pt.

As the functional layer 50, an RE-TM amorphous alloy independent of the crystal structure can be used. The RE-TM amorphous alloy can also be given the function of the recording layer 13 by adjusting the composition of the RE-TM amorphous alloy so that the coercive force decreases as the temperature rises. In this case, to increase the MR ratio, Co, Fe, Ni, or an alloy of any of these metals is inserted into the interface between the tunnel barrier layer 12 and ferromagnetic layers (recording layer 13 and fixed layer 11).

When using an ordered alloy such as FePt or CoPt as the fixed layer 11, the fct (001) plane must be oriented in order to generate perpendicular magnetic anisotropy. For this purpose, an ultra-thin underlying layer about a few nm thick made of MgO is preferably used as a crystal orientation control layer. Instead of MgO, it is also possible to use an element or compound having the fcc structure or bcc structure whose lattice constant is about 0.28, 0.40, or 0.56 nm. Examples are Pt, Pd, Ag, Au, Al, Cu, Cr, Fe, and alloys of these metals. In a bottom pin structure, the crystal orientation control layer need only be formed between the yoke layer and fixed layer 11. A buffer layer made of, e.g., Ta, TiN, or TaN may also be formed between the crystal orientation control layer and yoke material. In a top pin structure, MgO in which the fcc (100) plane is oriented is preferably used as the barrier layer. In this case, the crystal orientation control layer described above may also be additionally stacked so as not to decrease the MR.

The fct (001) plane must be similarly oriented even when using an ordered alloy such as FePt or CoPt as the recording layer 13. In the top pin (bottom free) structure, the crystal orientation control layer need only be formed between the yoke material and fixed layer 11. A buffer layer made of, e.g., Ta, TiN, or TaN may also be formed between the crystal orientation control layer and yoke material. In the bottom pin structure (top free) structure, MgO in which the fcc (100) plane is oriented is favorably used as the barrier layer. In this case, the above-mentioned crystal orientation control layer may also be additionally stacked so as not to decrease the MR.

When using an ordered alloy such as FePt or CoPt as the recording layer 13, FeRh having a (001)-plane lattice constant close to that of the recording layer 13 is used as the functional layer 50 added to the recording layer 13.

FeRh can also be used as the functional layer 50 even when using, e.g., the Co/Pt artificial lattice or Co/Pd artificial lattice as the recording layer 13.

Examples of the structure of the MTJ element according to this embodiment will be explained below.

Figure 9A:
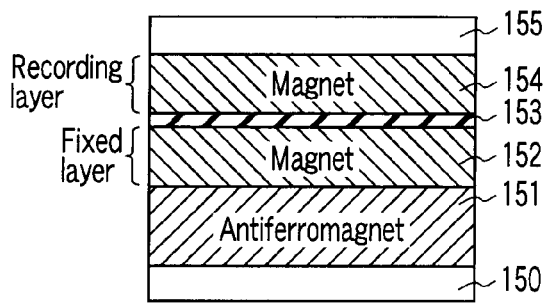
FIGS. 9A to 9E are sectional views showing examples of the MTJ element according to the first embodiment of the present invention.

FIG. 9A is a sectional view showing the first example of the MTJ element according to the first embodiment of the present invention. This MTJ element according to the first example is a so-called single junction type MTJ element. The first example of the MTJ element will be explained below.

As shown in FIG. 9A, an antiferromagnetic layer 151, ferromagnetic layer 152, tunnel barrier layer 153, ferromagnetic layer 154, and protective layer 155 are sequentially formed on an underlying layer 150.

In this example, the ferromagnetic layer 152 functions as a fixed layer (pinned layer or fixation layer) in which the magnetization direction is fixed, and the ferromagnetic layer 152 functions as a recording layer (free layer) in which the magnetization direction reverses. The antiferromagnetic layer 151 fixes the magnetization direction in the ferromagnetic layer 152. The magnetization direction in the ferromagnetic layer 152 functioning as a fixed layer may also be fixed by using, e.g., the antiferromagnetic layer 151.

Note that the underlying layer 150 is a layer that facilitates the formation of, e.g., the ferromagnetic layers and antiferromagnetic layer and protects these layers, and formed as needed. The protective layer 155 protects, e.g., the ferromagnetic layers and antiferromagnetic layer, and is formed as needed similarly to the underlying layer 150. The protective layer 155 may also be formed by using a hard mask layer or the like. These matters concerning the underlying layer 150 and protective layer 155 apply to the second to fourth examples explained below.

Figure 9B:
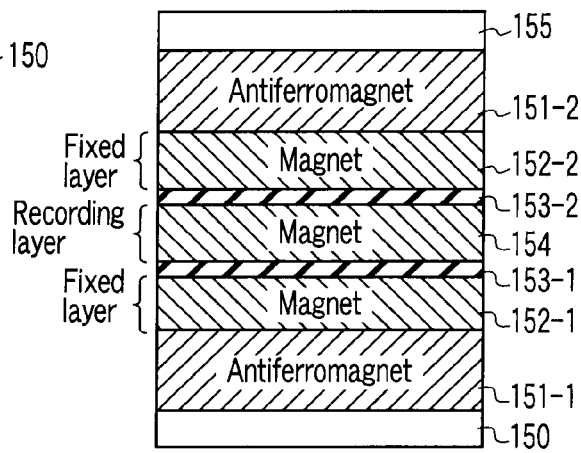

FIG. 9B is a sectional view showing the second example of the MTJ element according to the first embodiment of the present invention. This MTJ element according to the second example is a so-called double junction type MTJ element. The second example of the MTJ element will be explained below.

As shown in FIG. 9B, an antiferromagnetic layer 151-1, ferromagnetic layer 152-1, tunnel barrier layer 153-1, ferromagnetic layer 154, tunnel barrier layer 153-2, ferromagnetic layer 152-2, antiferromagnetic layer 151-2, and protective layer 155 are sequentially formed on an underlying layer 150.

In this example, the ferromagnetic layers 152-1 and 152-2 function as fixed layers, and the ferromagnetic layer 154 functions as a recording layer. The antiferromagnetic layer 151-1 fixes the magnetization direction in the ferromagnetic layer 152-1, and the antiferromagnetic layer 151-2 fixes the magnetization direction in the ferromagnetic layer 152-2.

Compared to the single junction type MTJ element shown in FIG. 9A, the double junction type MTJ element of this example has the advantage that it can further increase the ratio of the resistance value in a low-resistance state to that in a high-resistance state, i.e., a so-called MR ratio (magneto-resistance ratio).

Note that the fixed layer and recording layer may also have a structure including two ferromagnetic layers sandwiching a nonmagnetic layer such as a ferromagnetic layer/nonmagnetic layer/ferromagnetic layer, a structure including three ferromagnetic layers such as a ferromagnetic layer/nonmagnetic layer/ferromagnetic layer/nonmagnetic layer/ferromagnetic layer, or an extended structure including more ferromagnetic layers. In the spin injection type double-junction structure, however, one of the ferromagnetic layers 152-1 and 152-2 desirably has a multilayered structure including odd-numbered ferromagnetic layers, and the other desirably has a multilayered structure including even-numbered ferromagnetic layers. For example, the ferromagnetic layer 152-1 has a structure including two ferromagnetic layers, and the ferromagnetic layer 152-2 has a structure including three ferromagnetic layers.

Figure 9C:
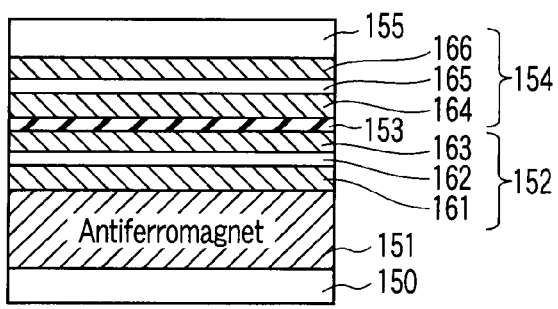

FIG. 9C is a sectional view showing the third example of the MTJ element according to the first embodiment of the present invention. In this MTJ element according to the third example, each of the ferromagnetic layers 152 and 154 of the MTJ element according to the first example has a stacked structure including ferromagnetic layers and a nonmagnetic layer. The third example of the MTJ element will be explained below.

As shown in FIG. 9C, an example of the stacked structure of the MTJ element according to the third example is a three-layered film including a ferromagnetic layer/nonmagnetic layer/ferromagnetic layer. In this example, the ferromagnetic layer 152 is a three-layered film including a ferromagnetic layer 161/nonmagnetic layer 162/ferromagnetic layer 163, and the ferromagnetic layer 154 is a three-layered film including a ferromagnetic layer 164/nonmagnetic layer 165/ferromagnetic layer 166.

When the ferromagnetic layer 152 functioning as a fixed layer is given the stacked structure, e.g., the three-layered film including the ferromagnetic layer 161/nonmagnetic layer 162/ferromagnetic layer 163, antiferromagnetic coupling is preferably generated between the ferromagnetic layers 161 and 163 via the nonmagnetic layer 162. In addition, an antiferromagnetic layer 151 is formed in contact with the three-layered film. This structure has the advantage that the magnetization direction in the ferromagnetic layer 152 functioning as a fixed layer, particularly, the ferromagnetic layer 163 can be fixed more strongly. This advantage makes the ferromagnetic layer 152, particularly, the ferromagnetic layer 163 hardly suffer the influence of a current magnetic field. Accordingly, unexpected reversal of the magnetization direction in the ferromagnetic layer 152 functioning as a fixed layer can be suppressed.

Likewise, even when the ferromagnetic layer 154 functioning as a recording layer is given the stacked structure, e.g., the three-layered film including the ferromagnetic layer 164/nonmagnetic layer 165/ferromagnetic layer 166, antiferromagnetic coupling is preferably generated between the ferromagnetic layers 164 and 166 via the nonmagnetic layer 165. In this case, the increase in switching magnetic field caused by the magnetic pole or the like can be suppressed because the magnetic flux closes itself within the three-layered film. Consequently, it is possible to obtain the advantage that the increase in power consumption caused by, e.g., a current magnetic field generated by a demagnetizing field can be suppressed even when the size of a memory cell, the MTJ element, or the like becomes submicron or less.

Also, the ferromagnetic layer 154 functioning as a recording layer may also have a stacked structure including a soft ferromagnetic layer and ferromagnetic layer. The soft ferromagnetic layer herein mentioned is a layer in which the magnetization direction reverses more easily than in a ferromagnetic layer or the like.

When the ferromagnetic layer 154 is given the stacked structure including the soft ferromagnetic layer and ferromagnetic layer, the soft ferromagnetic layer is placed close to a current magnetic field line, e.g., a bit line.

This stacked structure can further include a nonmagnetic layer. When the stacked structure is the three-layered film including the ferromagnetic layer 164/nonmagnetic layer 165/ferromagnetic layer 166 as in this example, the ferromagnetic layer 166, for example, may also be the soft ferromagnetic layer.

In this example, each of the ferromagnetic layers 152 and 154 is given the stacked structure. However, the stacked structure may also be given to only one of the ferromagnetic layers 152 and 154.

Figure 9D:
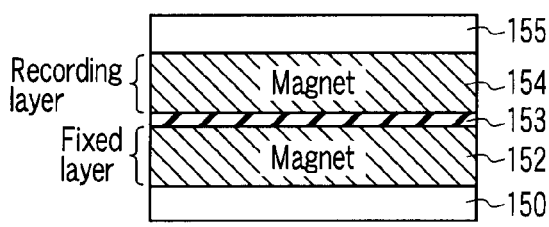
Figure 9E:
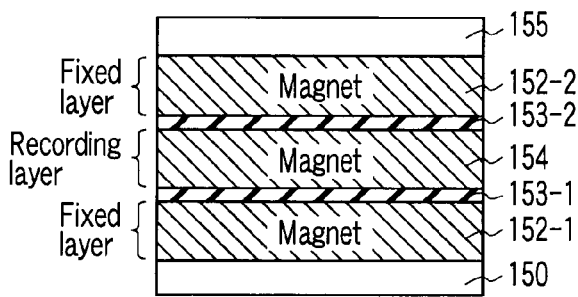

FIGS. 9D and 9E are sectional views each showing the fourth example of the MTJ element according to the first embodiment of the present invention. This MTJ element according to the fourth example is an example of a coercive force difference type structure obtained by omitting the antiferromagnetic layer 151 of the MTJ element according to each of the first and second examples. The fourth example of the MTJ element will be explained below.

As shown in FIGS. 9D and 9E, no antiferromagnetic layer 151 is formed adjacent to a ferromagnetic layer 152 functioning as a fixed layer. In this structure, the coercive force of the ferromagnetic layer 152 functioning as a fixed layer is made much larger than that of a ferromagnetic layer 154 functioning as a recording layer.

Note that in FIGS. 9A to 9E, "MAGNET" includes both "FERROMAGNET" and "FERRIMAGNET".

Note also that the functional layer 50 is applied to the single-junction structure in the explanation of FIGS. 8A and 8B, but the functional layer 50 may also be formed in the double-junction structure. Since the double-junction structure has two tunnel barrier layers, the functional layer can be inserted into one or both of the two tunnel barrier layers as shown in FIGS. 8A and 8B.

[1-7] Heater Layer

The heater layer HT is heated by supplying the electric current I2 between the bit line BL and transistor Tr via the memory element MC. Examples of the material of the heater layer HT are as follows. An optimum material is selected from these materials on the basis of the necessary heating temperature or process integration.

(a) Ni—Cr-based and Ni—Cr—Fe-based alloys, and alloys obtained by adding a small amount of Si to these alloys (b) Cu—Ni-based and Cu—Ni—Zn—W-based alloys (c) W, a W—Th oxide, and W-based alloys such as W—Mo and W—Re (d) Ta and Ta-based alloys such as Ta—W—Hf (e) A Ti—Al-oxide alloy

[1-8] Effects

The first effect of the first embodiment described above is the ability to increase the write efficiency and reduce the write current.

In the conventional MRAM cell, a write word line is formed above or below an MTJ element, a soft magnetic material portion as a recording layer is formed by a thin film, and magnetization in a magnetic layer is horizontal to the film surface. Accordingly, a current magnetic field for write horizontally enters the thin film, and the write efficiency decreases.

By contrast, in this embodiment, the write word line WL is formed to oppose the side surface of the MTJ element MTJ, so the current magnetic field for write can be applied perpendicularly to the film surface of the recording layer 13. Therefore, the efficiency of generation of the magnetic field to the MTJ element MTJ is 100 times or more the conventional efficiency. However, to make magnetization in a thin-film magnetic layer perpendicular to the film surface, perpendicular magnetic anisotropic energy Ku higher than the static magnetic energy ($2\pi Ms^2$) of the magnetic layer must be given to it, and this increases a reversing magnetic field Hsw to a few thousands Oe. This embodiment can reduce the static magnetic energy by vertically sandwiching the MTJ element MTJ by the yoke layers made of a soft magnetic material. Even when the reversing magnetic field Hsw is about 100 Oe, therefore, magnetization in the magnetic layer can be held perpendicularly.

Also, in this embodiment, to converge the magnetic flux generated by the write word line WL, the yoke layers YK-A and YK-L made of a soft magnetic material are formed above and below the write word line WL, thereby forming a closed magnetic loop. This largely reduces the write current.

Furthermore, in this embodiment, the heater layer HT is stacked below the MTJ element MTJ. In the write operation, the heater layer HT generates heat by the write current. Since this weakens the holing force of the MTJ element MTJ, the magnetization reversal threshold value can be decreased. Consequently, even a write operation using a low electric current can reverse magnetization.

An example of the actual calculation is as follows. Assuming that the reversing magnetic field Hsw is 30 Oe and the current magnetic field generation efficiency is 5 [Oe/mA], the write current is about 30/5=6 mA in an MRAM having the conventional horizontal magnetization type recording layer. By contrast, in this embodiment, data can be written in a recording layer having a reversing magnetic field Hsw of 100 Oe by a magnetic field having a hundredfold generation efficiency. Accordingly, the memory can operate with a write current of about 0.5 mA that is 1/30 the value of the conventional memory. This largely reduces the write current.

The second effect of the first embodiment described above is the ability to downsize a cell.

When making magnetization in a magnetic film perpendicular to the film surface by crystal magnetic anisotropy, the reversing magnetic field Hsw remains unchanged even when the pattern size of a magnetic material forming the cell decreases, because the reversing magnetic field Hsw is independent of the shape of a magnetic material. This makes it possible to form a cell very advantageous for downsizing compared to the conventional MRAM.

In this embodiment as has been described above, the memory element MC is formed by stacking the perpendicular magnetization type recording layer 13 and heater layer HT, and the yoke structure is formed by forming the yoke layers YK-A and YK-L above and below the word line WL for writing data in the cell. Since the memory element MC and yoke structure are integrated in self-alignment, a magnetic random access memory capable of increasing the density and reducing an electric current can be provided.

[2] Second Embodiment

The second embodiment is an example in which a soft magnetic layer is formed on a memory element in order to improve the yoke effect.

[2-1] Structure

Figure 10:
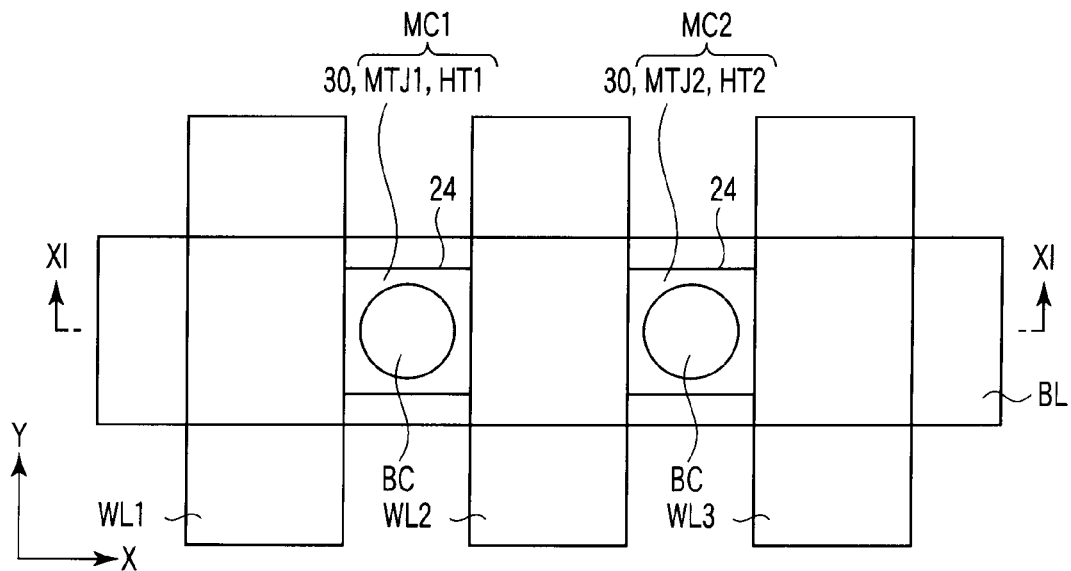
FIG. 10 is a plan view of a magnetic random access memory according to the second embodiment of the present invention.
Figure 11:
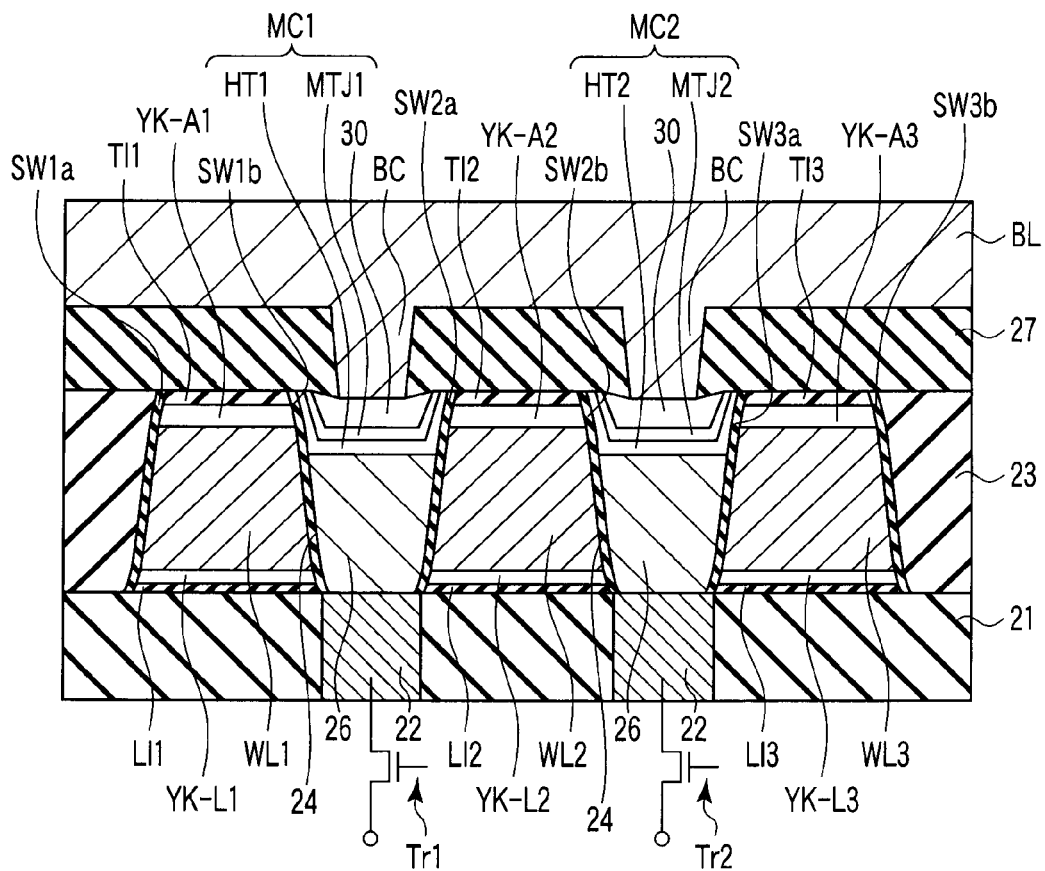
FIG. 11 is a sectional view taken along a line XI-XI in FIG. 10.

FIG. 10 is a plan view of a magnetic random access memory according to the second embodiment of the present invention. FIG. 11 is a sectional view taken along a line XI-XI in FIG. 10. The magnetic random access memory according to the second embodiment will be explained below.

As shown in FIGS. 10 and 11, the second embodiment differs from the first embodiment in that a soft magnetic layer 30 is formed on a memory element MC in a trench 24 between write word lines WL.

The soft magnetic layer 30 is stacked on the memory element MC in the step shown in FIG. 3F, and buried between the word lines WL by planarization performed by CMP. The soft magnetic layer 30 is made of a material used as yoke layers YK-A and YK-L.

[2-2] Effects

The second embodiment described above can achieve the same effects as in the first embodiment. In addition, the soft magnetic layer 30 is formed on the memory element MC in the second embodiment. In a write operation, this makes the closed loop of a magnetic field H generated by a write current I1 flowing through the word line WL more perfect, thereby further reducing the write current.

[3] Third Embodiment

The third embodiment is an example in which dummy elements are formed at the ends of two bits of memory elements.

[3-1] Structure

Figure 12:
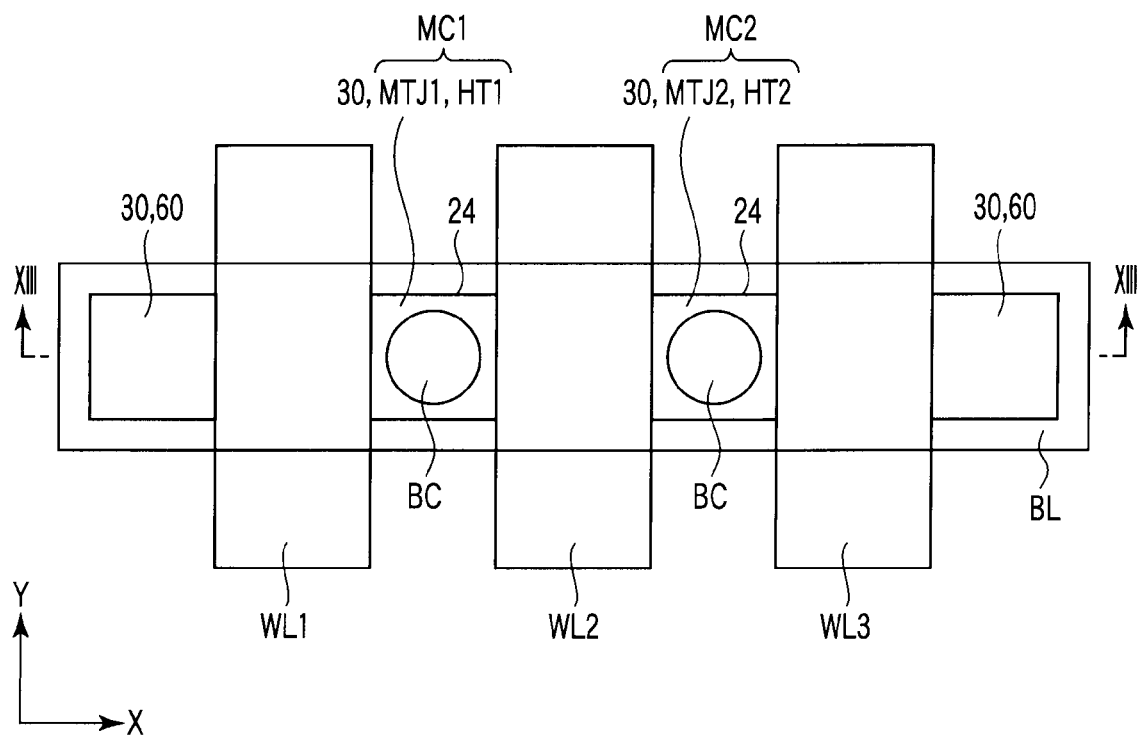
FIG. 12 is a plan view of a magnetic random access memory according to the third embodiment of the present invention.
Figure 13:
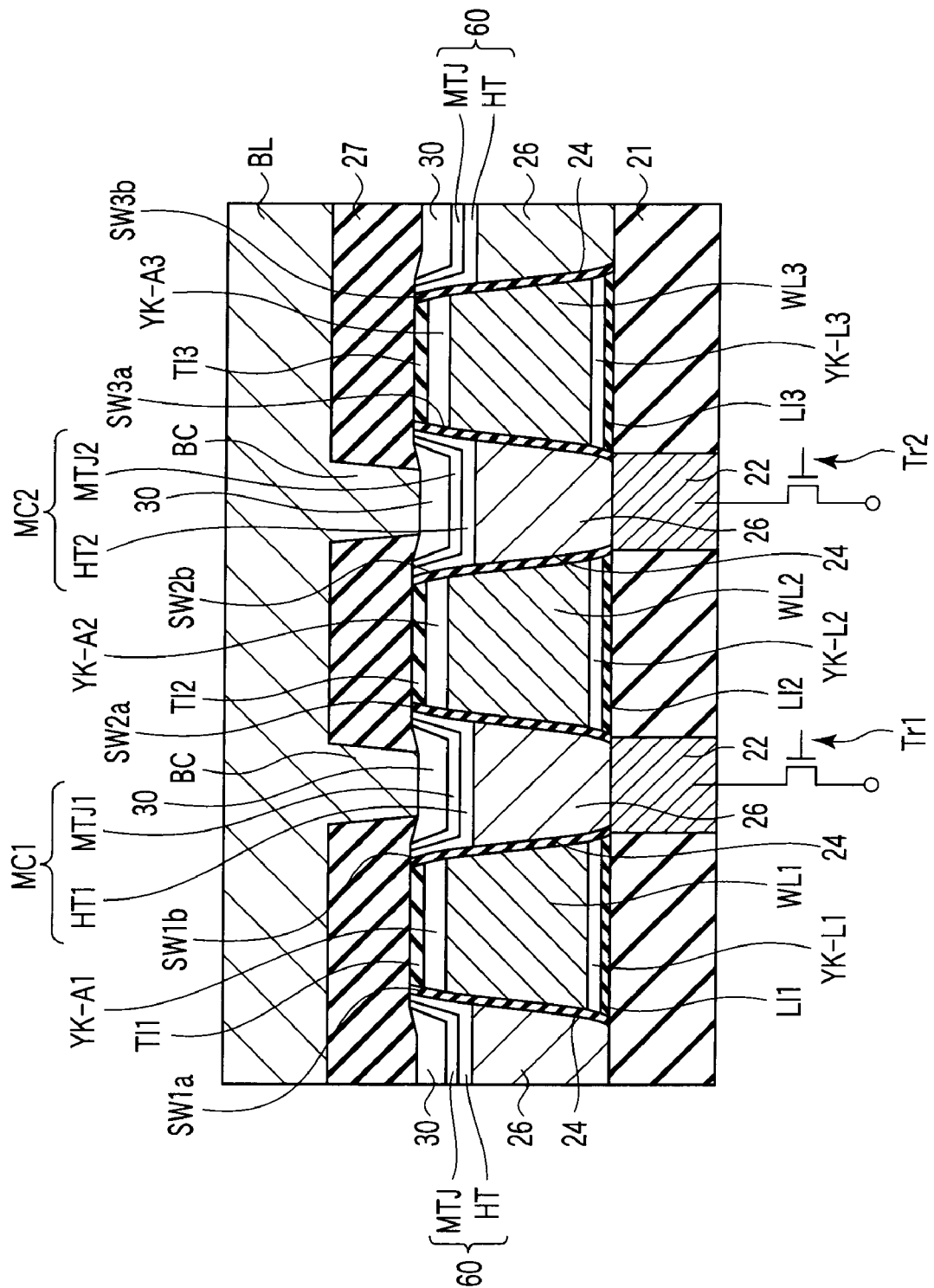
FIG. 13 is a sectional view taken along a line XIII-XIII in FIG. 12.

FIG. 12 is a plan view of a magnetic random access memory according to the third embodiment of the present invention. FIG. 13 is a sectional view taken along a line XIII-XIII in FIG. 12. The magnetic random access memory according to the third embodiment will be explained below.

As shown in FIGS. 12 and 13, the third embodiment differs from the first embodiment in that dummy elements 60 are formed outside word lines WL1 and WL3 sandwiching two bits of memory elements MC1 and MC2.

That is, in the first embodiment, the left side of the word line WL1 and the right side of the word line WL3 are covered with the interlayer dielectric film 23. By contrast, in the third embodiment, a contact 26, heater layer HT, MTJ element MTJ, and soft magnetic layer 30 are buried in each of trenches 24 on the left side of the word line WL1 and the right side of the word line WL3. Note that the heater layers HT and MTJ elements MTJ in these portions are not connected to a bit line BL because they form the dummy elements 60.

[3-2] Manufacturing Method

In a method of manufacturing the structure according to the third embodiment, the shape of a mask used when etching away the interlayer dielectric film 23 in the step shown in FIG. 3D differs from that in the first embodiment.

The first embodiment uses the mask including only two bits of cell regions. On the other hand, this embodiment uses a mask covering three bits or more of cells. Consequently, the interlayer dielectric film 23 exposed from the mask is removed, and the trenches 24 are formed on the left side of the word line WL1 and the right side of the word line WL3 as well. In the later process, therefore, the contact 26, heater layer HT, MTJ element MTJ, and soft magnetic layer 30 are buried in each of the trenches 24 on the left side of the word line WL1 and the right side of the word line WL3, as in the cell portions.

[3-3] Effects

The third embodiment described above can achieve the same effects as in the first embodiment. In addition, in the third embodiment, the memory element MC1 and dummy element 60 exist on the two sides of the word line WL1, and the memory element MC2 and dummy element 60 exist on the two sides of the word line WL3. When compared to the case where no dummy element 60 exists, therefore, magnetic fields generated by supplying an electric current I1 through the word lines WL1 and WL3 become more perfect closed loops. This improves the stability of the cell operation.

[4] Fourth Embodiment

The fourth embodiment is an example in which a memory element MC formed between word lines WL is not self-aligned with them.

[4-1] Structure

Figure 14:
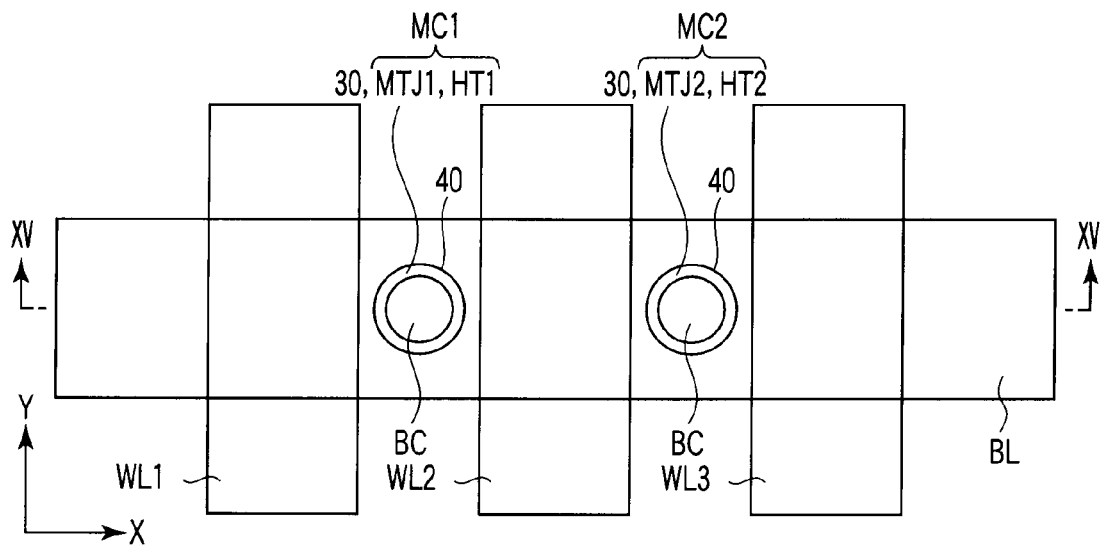
FIG. 14 is a plan view of a magnetic random access memory according to the fourth embodiment of the present invention.
Figure 15:
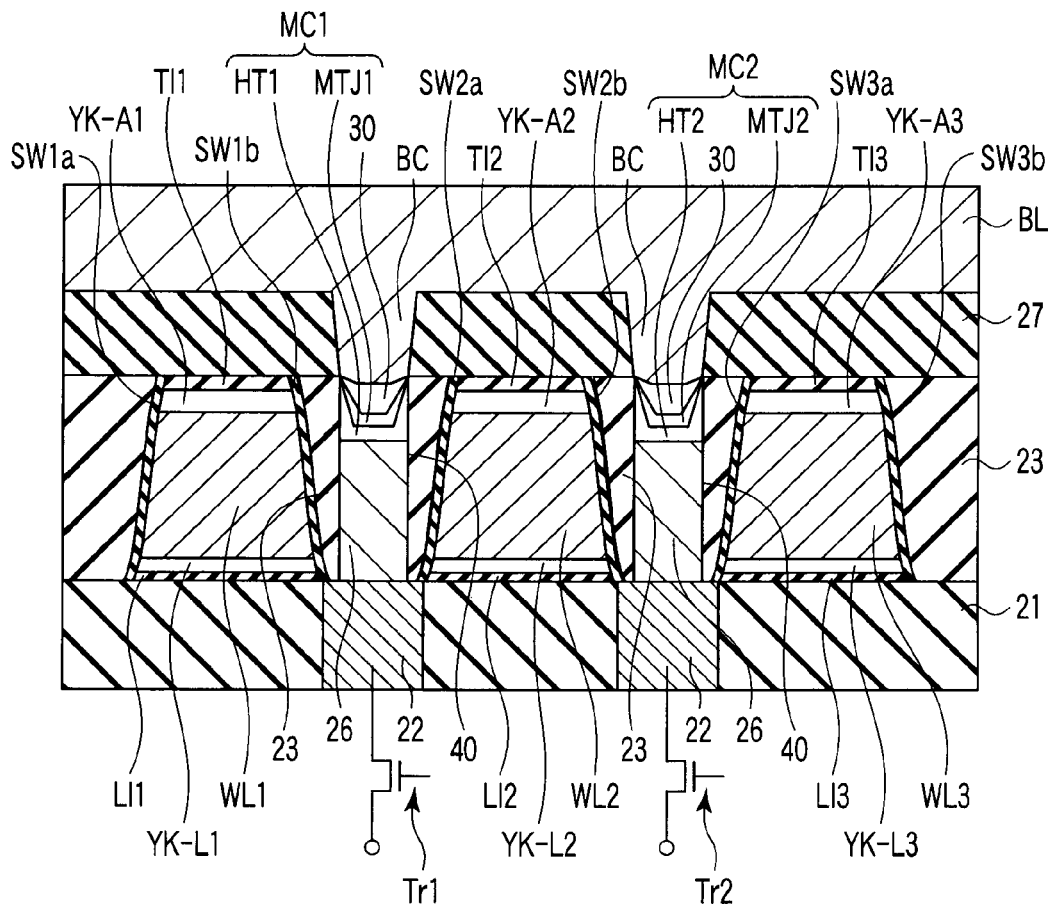
FIG. 15 is a sectional view taken along a line XV-XV in FIG. 14.

FIG. 14 is a plan view of a magnetic random access memory according to the fourth embodiment of the present invention. FIG. 15 is a sectional view taken along a line XV-XV in FIG. 14. The magnetic random access memory according to the fourth embodiment will be explained below.

As shown in FIGS. 14 and 15, the fourth embodiment differs from the first embodiment in that a trench 40 is formed in an interlayer dielectric film 23 between the word lines WL, and the memory element MC is formed in the trench 40.

In the first embodiment, the width of the memory element MC and contact 26 in the bit line direction is equal to the distance between the sidewall insulating films SW of the word lines WL. In the fourth embodiment, however, the width of the memory element MC and a contact 26 in the bit line direction is smaller than the distance between sidewall insulating films SW of the word lines WL. In other words, the memory element MC and contact 26 are formed in the trench 40 having an opening width smaller than the distance between the sidewall insulating films SW of the word lines WL.

[4-2] Manufacturing Method

In a method of manufacturing the structure according to the fourth embodiment, a mask having a circular opening for each memory element is formed after the step shown in FIG. 3C. This mask is used to form the trenches 40 in the interlayer dielectric film 23 between word lines WL1 and WL2 and between the word line WL2 and a word line WL3. After that, the same step as in FIG. 3E is performed.

[4-3] Effects

The fourth embodiment described above can achieve the same effects as in the first embodiment. In addition, the memory element MC formed between the word lines WL is not self-aligned with them in the fourth embodiment. That is, the trench 40 is formed in the interlayer dielectric film 23 between the word lines WL, and the memory element MC is formed in the trench 40. In the processing for forming contacts, therefore, the word lines WL are not easily damaged by etching. This facilitates the processing.

[5] Fifth Embodiment

The fifth embodiment is an example in which write currents are supplied to word lines on the two sides of a memory element MC in a write operation.

[5-1] Write Operation

Figure 17:
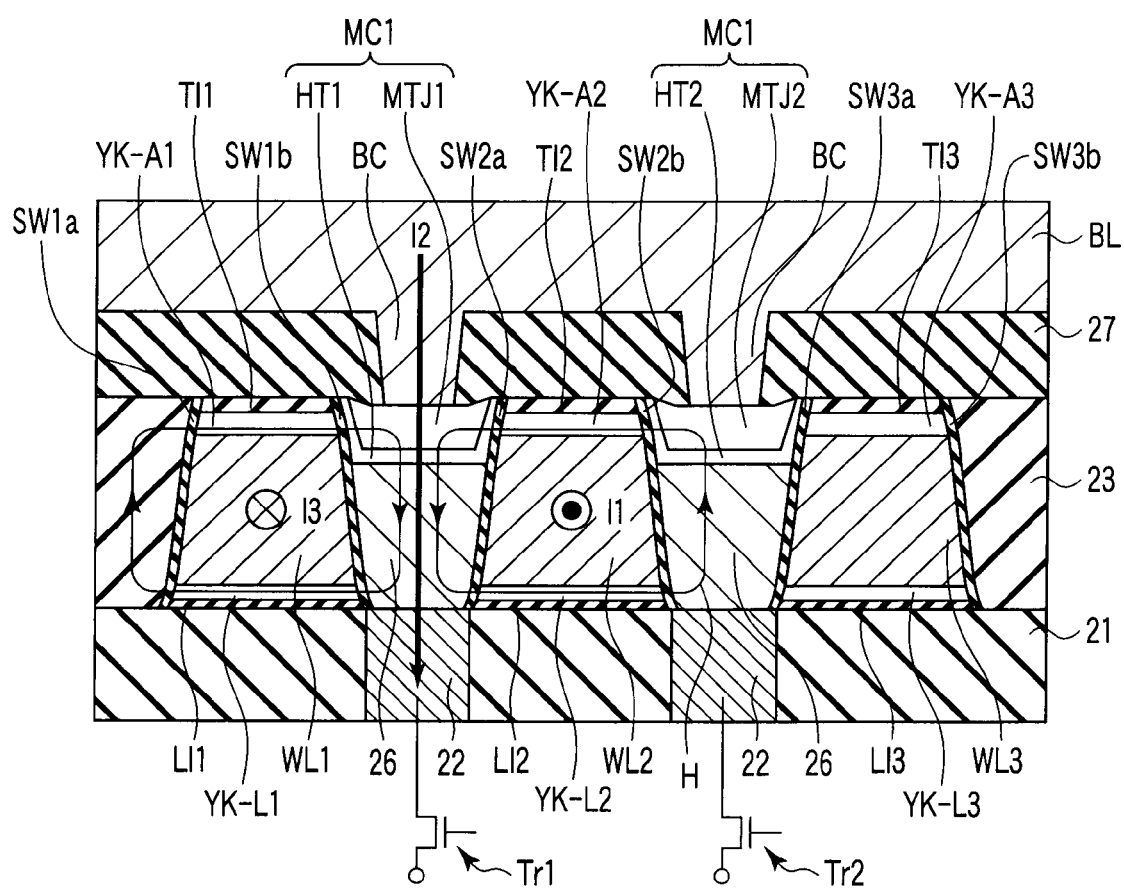
FIG. 17 is a sectional view for explaining the write operation according to the fifth embodiment of the present invention.

FIGS. 16 and 17 are views for explaining the write operation according to the fifth embodiment of the present invention. A thermally assisted write operation will be explained below by taking the case where a memory element MC1 is selected as an example.

As shown in FIGS. 16 and 17, when writing data in the memory element MC1 in the fifth embodiment, electric currents I3 and I1 are respectively supplied to word lines WL1 and WL2 on the two sides of the memory element MC1. As a consequence, a synthetic magnetic field generated by the write currents I1 and I3 is applied to the memory element MC1.

Note that the write currents I1 and I3 are supplied in opposite directions in order to apply magnetic fields to the MTJ element in the same direction.

[5-2] Effects

The fifth embodiment described above can achieve the same effects as in the first embodiment. In addition, in the fifth embodiment, the electric currents I1 and I3 are supplied to the write word lines WL on the two sides of the memory element MC in the write operation. This makes it possible to reduce the values of the write currents I1 and I3.

[6] Sixth Embodiment

The sixth embodiment is an example in which a bit line current for thermal assist functions as a spin injection write current.

[6-1] Write Operation

In the first embodiment, the electric current I2 is supplied from the bit line BL to the transistor Tr in order to achieve thermal assist, but the direction of the electric current I2 is not defined. By contrast, the sixth embodiment defines the direction of an electric current I2 in accordance with write data, thereby allowing spin-polarized electrons generated by the electric current I2 to act on a recording layer 13. The sixth embodiment thus uses the principle of spin injection magnetization reversal. In the write operation according to the sixth embodiment, therefore, a current magnetic field H generated by an electric current I1 and the spin-polarized electrons generated by the electric current I2 act on magnetization in the recording layer 13.

In data write using spin injection magnetization reversal, the magnetization directions in a fixed layer 11 and the recording layer 13 become parallel or antiparallel in accordance with the direction of the electric current I2 supplied between the fixed layer 11 and recording layer 13. Accordingly, the direction of the electric current I2 is defined as follows.

When writing data "1", an electric current I is supplied from the fixed layer 11 to the recording layer 13 of an MTJ element MTJ. That is, electrons e are injected into the fixed layer 11 from the recording layer 13. This makes the magnetization directions in the fixed layer 11 and recording layer 13 opposite and antiparallel. A high-resistance state Rap like this is defined as data "1".

On the other hand, when writing data "0", the electric current I is supplied from the recording layer 13 to the fixed layer 11 of the MTJ element MTJ. That is, the electrons e are injected into the recording layer 13 from the fixed layer 11. This makes the magnetization directions in the fixed layer 11 and recording layer 13 the same and parallel. A low-resistance state Rp like this is defined as data "0".

Note that in this embodiment, it is desirable to start supplying the write current I2 to a memory element MC after the supply of the write current I1 to a word line WL is started.

[6-2] Effects

The sixth embodiment described above can achieve the same effects as in the first embodiment. In addition, in the write operation, the sixth embodiment allows the current magnetic field H generated by the electric current I1 and the spin-polarized electrons generated by the electric current I2 to act on magnetization in the recording layer 13, thereby further reducing the write currents. Also, the threshold value of the electric current required for spin injection can be decreased by assist by an external magnetic field. Since this makes it possible to use an operation range having a margin to the breakdown voltage of a tunnel barrier, the long-term reliability of the cell is ensured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a bit line running in a first direction;
a first word line running in a second direction different from the first direction;
a memory element having a magnetoresistive effect element including a fixed layer having a fixed magnetization direction, a recording layer having a reversible magnetization direction, and a nonmagnetic layer formed between the fixed layer and the recording layer, the magnetization directions in the fixed layer and the recording layer being perpendicular to a film surface, and a heater layer in contact with the magnetoresistive effect element, the memory element being connected to the bit line, and formed to oppose a side surface of the first word line such that the memory element is insulated from the first word line first and second yoke layers formed by using a soft magnetic material in direct contact with respective lower and upper surfaces of the first word line; and a sidewall insulating film formed on side surfaces, which oppose the memory element, of the first word line and the first and second yoke layers, and in direct contact with the memory element.

2. The memory according to claim 1, further comprising an upper insulating film formed on the yoke layer on the upper surface of the first word line, and having a film thickness larger than that of the sidewall insulating film.

3. The memory according to claim 1, further comprising an upper insulating film formed on the yoke layer on the upper surface of the first word line, and made of the same material as that of the sidewall insulating film.

4. The memory according to claim 1, further comprising a contact formed to oppose the side surface of the first word line, in contact with the sidewall insulating film, and connected to the memory element.

5. The memory according to claim 4, wherein the contact is made of a soft magnetic material.

6. The memory according to claim 1, further comprising:
a lower barrier metal film formed between the lower surface of the first word line and the yoke layer; and
an upper barrier metal film formed between the upper surface of the first word line and the yoke layer.

7. The memory according to claim 1, wherein the heater layer is in direct contact with the recording layer.

8. The memory according to claim 1, further comprising a soft magnetic layer formed on the memory element to oppose the side surface of the first word line.

9. The memory according to claim 1, further comprising:
a second word line formed apart from the first word line to oppose the side surface of the first word line, sandwiching the memory element together with the first word line, and running in the second direction; and
an insulating film buried between the first word line and the second word line, and having a trench whose width is smaller than a distance between the first word line and the second word line, the memory element being formed in the trench.

10. The memory according to claim 1, further comprising:
a second word line formed apart from the first word line to oppose the side surface of the first word line, sandwiching the memory element together with the first word line, and running in the second direction;
a first sidewall insulating film formed on the side surface of the first word line, and in direct contact with the memory element;
a second sidewall insulating film formed on a surface, which opposes the memory element, of the second word line, and in direct contact with the memory element; and
a contact sandwiched between the first word line and the second word line, in direct contact with the first sidewall insulating film and the second sidewall insulating film, and connected to the memory element.

* * * * *